(12) United States Patent
Jang et al.

(10) Patent No.: US 12,211,711 B2
(45) Date of Patent: Jan. 28, 2025

(54) BAKING APPARATUS

(71) Applicant: Samsung Electronics Co., Ltd., Suwon-si (KR)

(72) Inventors: Bumjin Jang, Hwaseong-si (KR); Seunghwa Kang, Hwaseong-si (KR); Sungyong Park, Suwon-si (KR); Ansook Sul, Hwaseong-si (KR); Kiju Sohn, Gunpo-si (KR); Wonguk Seo, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 424 days.

(21) Appl. No.: 17/666,796

(22) Filed: Feb. 8, 2022

(65) Prior Publication Data

US 2022/0344181 A1 Oct. 27, 2022

(30) Foreign Application Priority Data

Apr. 22, 2021 (KR) .................. 10-2021-0052494

(51) Int. Cl.
*H01L 21/67* (2006.01)
*H01L 21/324* (2006.01)

(52) U.S. Cl.
CPC ...... *H01L 21/67109* (2013.01); *H01L 21/324* (2013.01); *H01L 21/67017* (2013.01); *H01L 21/6719* (2013.01); *H01L 21/67248* (2013.01)

(58) Field of Classification Search
CPC ............ H01L 21/67109; H01L 21/324; H01L 21/67017; H01L 21/6719; H01L 21/67248
USPC ......................................................... 454/49
See application file for complete search history.

(56) References Cited

U.S. PATENT DOCUMENTS

| 6,454,863 B1* | 9/2002 | Halpin ............ H01L 21/67115 |
| | | 392/416 |
| 6,590,186 B2* | 7/2003 | Tanaka ............ H01L 21/67109 |
| | | 118/724 |
| 7,887,670 B2* | 2/2011 | Koizumi .......... C23C 16/45589 |
| | | 118/715 |

(Continued)

FOREIGN PATENT DOCUMENTS

| KR | 2002-0081725 A | 10/2002 |
| KR | 2004-0078357 A | 9/2004 |

(Continued)

*Primary Examiner* — Avinash A Savani
*Assistant Examiner* — Dana K Tighe
(74) *Attorney, Agent, or Firm* — HARNESS, DICKEY & PIERCE, P.L.C.

(57) ABSTRACT

A baking apparatus, may include a processing chamber including a lower chamber and an upper chamber connected by a ring shutter; a baking plate in the processing chamber adjacent to a region in which the lower chamber and the ring shutter overlap; an active flow controller including a first module and a second module in the lower chamber adjacent to the baking plate; a first auxiliary flow controller on a lower part of the ring shutter, adjacent to the lower chamber; and a second auxiliary flow controller in the upper chamber adjacent to the ring shutter. The active controller may be configured to move based on movement of the first module in a first direction perpendicular to an upper surface of the baking plate. The active flow controller may be configured to control airflow around the second module by movement of the second module.

20 Claims, 20 Drawing Sheets

(56) References Cited

U.S. PATENT DOCUMENTS

| | | | | |
|---|---|---|---|---|
| 9,307,653 | B2* | 4/2016 | Yoshihara | ............... B08B 3/024 |
| 10,825,701 | B2* | 11/2020 | George | ................ F27D 3/0084 |
| 2006/0151462 | A1 | 7/2006 | Lee et al. | |
| 2021/0323036 | A1* | 10/2021 | Matsushima | ............. B08B 3/10 |
| 2022/0308462 | A1* | 9/2022 | Berney | ..................... G03F 7/16 |

FOREIGN PATENT DOCUMENTS

| | | |
|---|---|---|
| KR | 100601979 B1 | 7/2006 |
| KR | 2008-0062213 A | 7/2008 |
| KR | 100947481 B1 | 3/2010 |
| KR | 101909481 B1 | 10/2018 |

\* cited by examiner

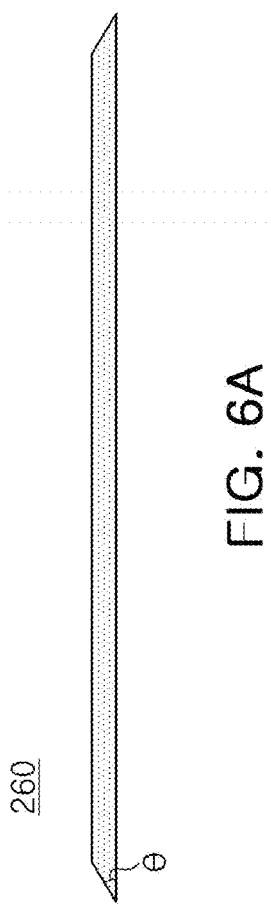

BAKING APPARATUS

CROSS-REFERENCE TO RELATED APPLICATION(S)

This application claims benefit of priority to Korean Patent Application No. 10-2021-0052494 filed on Apr. 22, 2021 in the Korean Intellectual Property Office, the disclosure of which is incorporated herein by reference in its entirety.

BACKGROUND

1. Field

The present disclosure relates to a baking apparatus.

2. Description of Related Art

A semiconductor process for manufacturing a semiconductor device may include a photoresist coating process of coating photoresist on a wafer, an exposure process of aligning the photoresist-coated wafer with a mask and then transferring a mask pattern to the photoresist, and a photolithography process including a developing process of forming a pattern on a wafer. Before and after the photolithography process, a baking process for curing the photoresist may be performed. Meanwhile, when the baking process is performed, the photoresist may be evaporated and fumes may be generated. The generated fumes may adhere to the wafer, contaminate the wafer, and may further lead to defects in semiconductor devices.

SUMMARY

An aspect of inventive concepts is to provide a baking apparatus capable of removing a vortex formed in a vicinity of a wafer, and improving an airflow velocity distribution on a surface of the wafer by controlling a flow of gas introduced to exhaust fumes generated in the baking process.

According to an embodiment of inventive concepts, a baking apparatus may include a processing chamber, a baking plate, an active flow controller, a first auxiliary flow controller, and a second auxiliary flow controller. The processing chamber may include a lower chamber and an upper chamber connected by a ring shutter. The baking plate may be in the processing chamber adjacent to a region in which the lower chamber and the ring shutter overlap. The baking plate may be for supporting a wafer having a photoresist film formed thereon. The active flow controller may include a first module and a second module in the lower chamber adjacent to the baking plate. The active controller may be configured to move based on movement of the first module in a first direction perpendicular to an upper surface of the baking plate. The active flow controller may be configured to control airflow around the second module by movement of the second module. The first auxiliary flow controller may be on a lower part of the ring shutter adjacent to the lower chamber. The second auxiliary flow controller may be in the upper chamber adjacent to the ring shutter.

According to an embodiment of inventive concepts, a baking apparatus may include a processing chamber including a lower chamber and an upper chamber connected by a ring shutter; a baking plate in the processing chamber for supporting a wafer having a photoresist film formed thereon; a discharge unit connected to the processing chamber and configured to discharge fumes generated while the photoresist film is cured; a plurality of inlets for introducing gas for discharging the fumes from an outside of the processing chamber; and at least one flow controller for controlling a flow of the gas introduced through the plurality of inlets. The at least one flow controller may be configured to move in a first direction perpendicular to an upper surface of the baking plate.

According to an embodiment of inventive concepts, a baking apparatus may include a processing chamber including a lower chamber and an upper chamber connected by a ring shutter; a baking plate in the processing chamber adjacent to a region in which the lower chamber and the ring shutter overlap, the baking plate for supporting a wafer having a photoresist film formed thereon; and an active flow controller including a first module and a second module in the lower chamber adjacent to the baking plate. The active controller may be configured to move based on movement of the first module in a first direction perpendicular to an upper surface of the baking plate. The active controller may be configured to control airflow around the second module by movement of the second module. While the baking process is performed on the wafer, gas introduced from an outside of the processing chamber may flow from an upper portion of the wafer to a central direction of the baking plate.

BRIEF DESCRIPTION OF DRAWINGS

The above and other aspects, features and other advantages of the present disclosure will be more clearly understood from the following detailed description, taken in conjunction with the accompanying drawings, in which:

FIGS. 6A and 6B are a side view and a top view of a flow controller included in a baking apparatus according to an example embodiment of inventive concepts;

DETAILED DESCRIPTION

Figure 1:
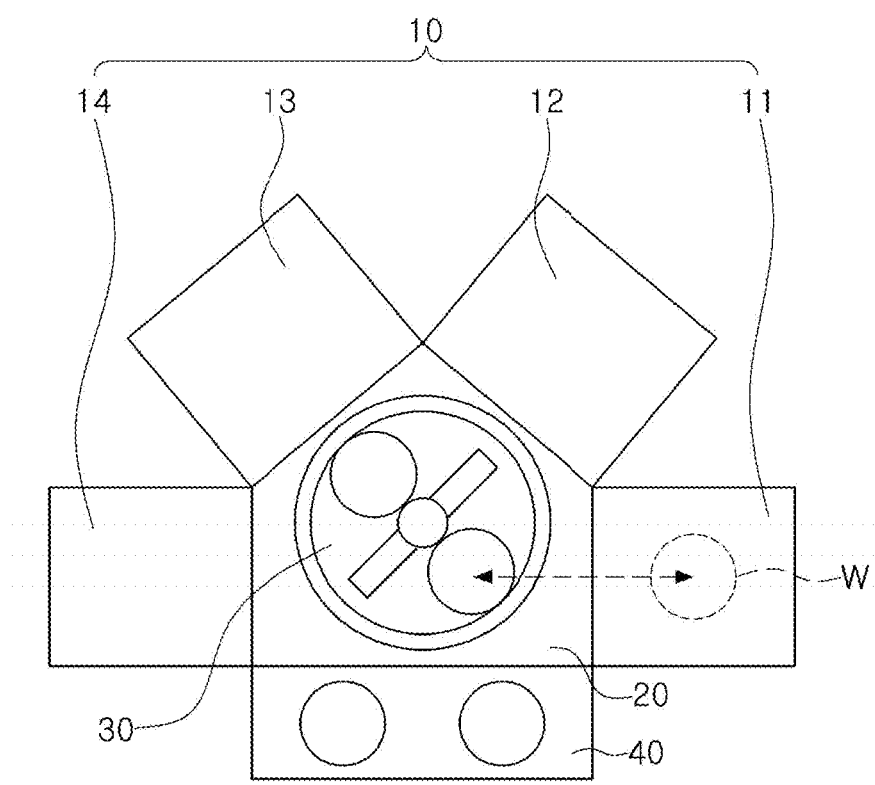
FIG. 1 is a schematic configuration diagram of semiconductor processing equipment including a baking apparatus according to an example embodiment of inventive concepts.

Hereinafter, a plasma processing apparatus according to example embodiments of inventive concepts will be described with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the drawings and the specification, it will be understood that, although the terms including ordinal numbers such as "first", "second", "third", and the like, used herein may be used to describe various elements, these elements should not be limited by these terms. These terms such as "first", "second", "third", and the like, are only used to distinguish one element from another element. For example, a first element may be termed a second element and a second element may be termed a first element without departing from the teachings of inventive concepts.

FIG. 1 is a schematic configuration diagram of a semiconductor process equipment including a baking apparatus according to an example embodiment of inventive concepts.

Referring to FIG. 1, a semiconductor process equipment 1 including a baking apparatus according to an example embodiment of inventive concepts may include a plurality of processing chambers 11-14 for performing a semiconductor process with respect to a substrate W. For example, the plurality of processing chambers 11 to 14 may include a deposition processing chamber for performing a deposition process, a polishing processing chamber for performing a chemical mechanical polishing (CMP) process, an etching processing chamber for removing plasma including radicals and ions of a source gas, a photolithography processing chamber for forming a fine electronic circuit pattern, and the like.

For example, a substrate W may be a semiconductor substrate on which a semiconductor process is performed, and/or a wafer formed of a semiconductor material such as silicon. Semiconductor devices formed on the substrate W by semiconductor processes performed in the plurality of processing chambers 11 to 14, wiring patterns connected to the semiconductor devices, insulating layers covering the semiconductor devices and the wiring patterns, and the like, may be formed, and a plurality of semiconductor chips may be produced from the substrate W.

For example, the plurality of processing chambers 11 to 14 may receive the substrate W through a transfer chamber 20 and a load lock chamber 40 to perform a semiconductor process. The transfer chamber 20 and the load lock chamber 40 may include a transfer robot 30, and the transfer robot 30 of the transfer chamber 20 and the load lock chamber 40 may transfer a substrate W, or the like, which is a process object. For example, the transfer robot 30 of the transfer chamber 20 may remove a process object such as the substrate W, or the like, from the load lock chamber 40, and transfer the same to the plurality of processing chambers 11 to 14, and/or may transfer the process object between the processing chambers 11 to 14. In an example embodiment, the transfer robot may be a handler.

The transfer robot 30 may include a chuck for fixing the process object and a linear stage for transferring the process object. For example, the chuck may be an electrostatic chuck (ESC) for fixing a process object using electrostatic force. A plurality of protrusions may be formed above the electrostatic chuck to contact the process object.

Referring to FIG. 1, in a semiconductor processing equipment 1 including a baking apparatus according to an example embodiment of inventive concepts, the transfer robot 30 of the transfer chamber 20 may remove the substrate W from the load lock chamber 40, and transfer the substrate W, which is a process object, to the processing chamber 11. However, in some example embodiments, a process object may not be limited to a wafer. For example, the substrate W may be various substrates other than a wafer, for example, a mother substrate for a display.

The photolithography process may include a photoresist coating process, an exposure process, and a developing process, and before and after the exposure process, a baking process for curing the photoresist coated to an upper surface of the substrate W may be performed. For example, at least one processing chamber 11 of the processing chambers 11 to 14 may be allocated as a chamber for performing a baking process. For example, equipment for performing a baking process including the processing chamber 11 may be defined as a baking apparatus.

Figure 2:
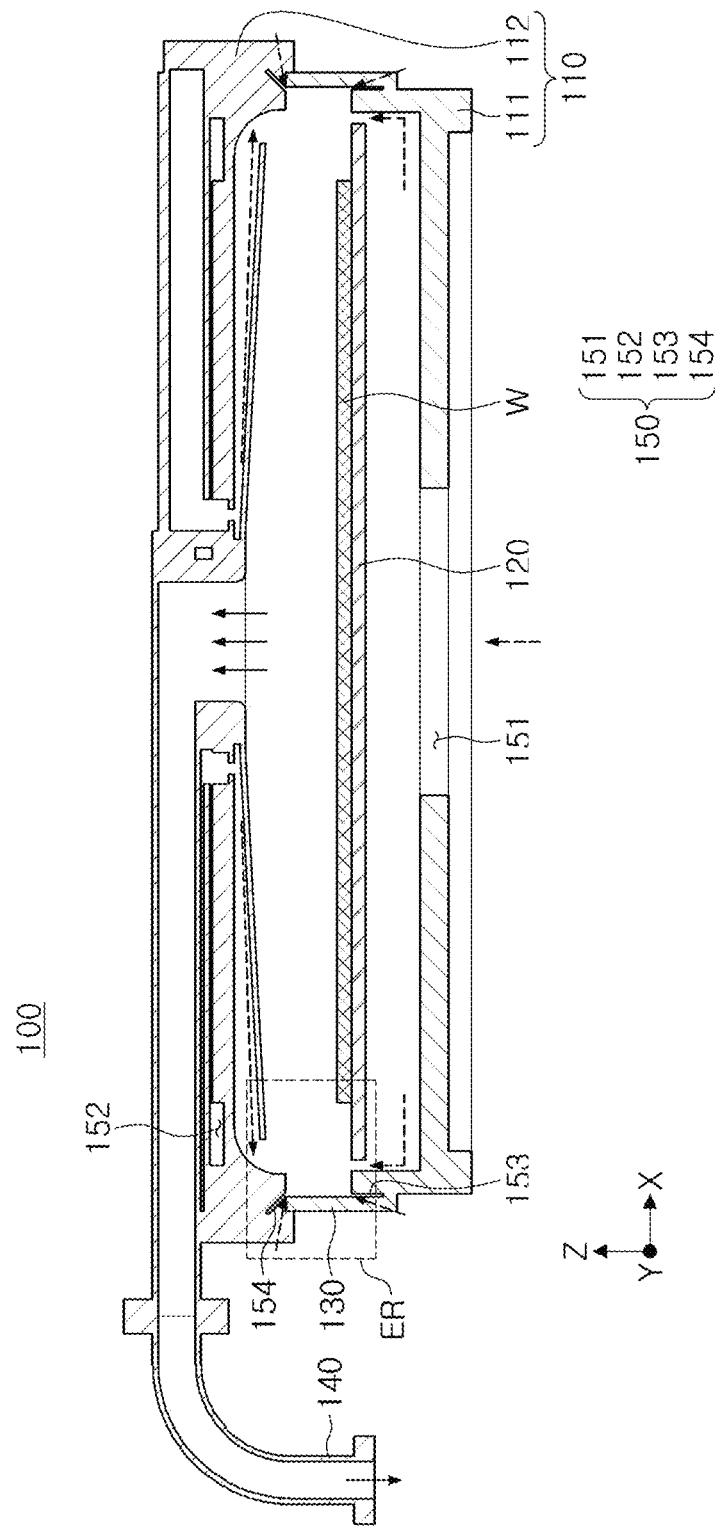
FIG. 2 is a schematic diagram illustrating a general baking apparatus.

FIG. 2 is a view schematically illustrating a general baking apparatus.

Referring to FIG. 2, a general baking apparatus 100 may include a processing chamber 110, a baking plate 120, a ring shutter 130, a discharge unit 140, and a plurality of inlets 150.

Although not shown, heating elements such as thermoelectric devices and/or circuit heaters may be connected to a lower surface of the baking plate 120 to heat the baking plate 140. The ring shutter 130 may be a portion of the lower chamber 111, or a separate body connected thereto, that may extend vertically from a side of the lower chamber 111 toward the upper chamber 112. The discharge unit 140 may define a conduit path for discharging fumes and/or gases away from the wafer W.

A wafer W, having photoresist coated thereon, may be transferred to an upper portion of the baking plate 120 provided in the processing chamber 110 by the transfer robot 30 illustrated in FIG. 1. The baking process may be performed by loading the wafer photoresist-coated wafer W on the baking plate 120, and then heating the baking plate 120 and baking the photoresist.

The photoresist may include a polymer, a photosensitizer, a solvent, and an additive. The polymer may serve as a mask during an etching and/or ion implantation process, and the photosensitizer may react with light irradiated during the exposure process to modify a structure of the polymer. Meanwhile, the solvent may allow the coating process of the photoresist to proceed smoothly. However, since the solvent may interfere with the exposure process and adsorption of a photoresist film, the baking apparatus 100 may remove the solvent through the baking process.

In the baking apparatus 100 illustrated in FIG. 2, the processing chamber 110 may include a lower chamber 111 and an upper chamber 112. The lower chamber 111 and the upper chamber 112 may be connected by a ring shutter 130 disposed in a ring shape at an outer periphery of the baking plate 120. The ring shutter 130 may move vertically in a first direction (e.g., Z direction), perpendicular to an upper surface of the wafer W. That is, the ring shutter 130 may be connected to the lower chamber 111 and the upper chamber 112 to separate an inside of the processing chamber 110 from the outside.

While the photoresist coated to the wafer W is cured as the baking process proceeds, fumes may be generated in the processing chamber 110. The fumes may include metal particles such as TiN. Metal particles included in the fumes generated in the baking process may be attached to the baking plate 120 and the wafer W inside the processing chamber 110 to contaminate the baking plate 120 and the wafer W, thereby causing process defects.

The baking apparatus 100 may inject exhaust gas into a first inlet 151 connected to the lower chamber 111 and exhaust gas into a second inlet 152 connected to an upper chamber in order to discharge the fumes to the discharge unit 140. The gas injected into the first inlet 151 may be introduced again between the baking plate 120 and the ring shutter 130, and the gas injected into the second inlet 152 may be introduced into the processing chamber 110 through the upper chamber 112 adjacent to the ring shutter 130.

Meanwhile, a space between the ring shutter 130 and the lower chamber 111 and between the ring shutter 130 and the upper chamber 112 may not be completely sealed. Accordingly, external gas may be introduced into the processing chamber 110 during the baking process. For example, external gas may flow into a third inlet 153 between the ring shutter 130 and the lower chamber 111 and into a fourth inlet 154 between the ring shutter 130 and the upper chamber 112. The gas introduced through the plurality of inlets 150 including the first to fourth inlets 151, 152, 153, and 154 may form first to fourth airflows in the processing chamber 110, respectively.

Figure 3:
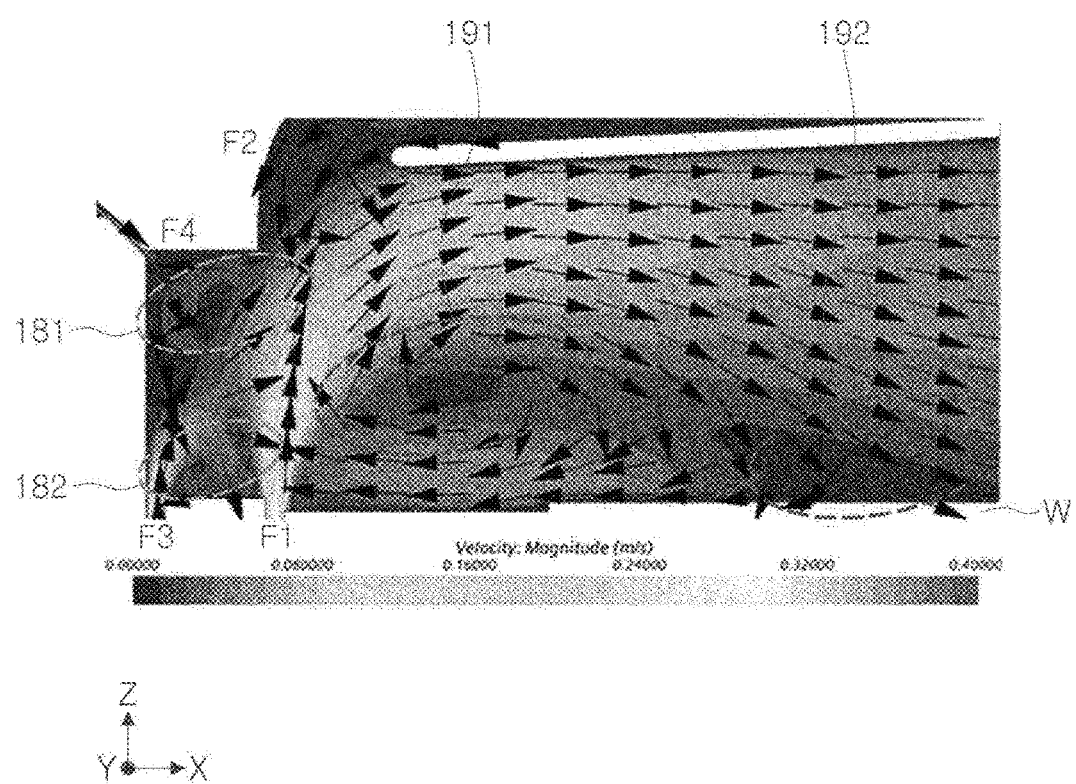
FIG. 3 is a view illustrating a problem that may occur in a general baking apparatus.

FIG. 3 is a view illustrating a problem that may occur in a general baking apparatus.

FIG. 3 may illustrate a simulation result of a flow of exhaust gas in an edge region ER when a baking process is performed in the baking apparatus 100 illustrated in FIG. 2.

Referring to FIG. 3, the gas introduced through the plurality of inlets may form first to fourth airflows F1, F2, F3, and F4 inside the processing chamber 110. The flow of the exhaust gas in the processing chamber 110 may be determined by the first to fourth airflows F1, F2, F3, and F4. The first to fourth airflows F1, F2, F3, and F4 may form a vortex in which the airflow swirls in an edge region inside the processing chamber 110.

The vortex formed inside the processing chamber 110 may limit and/or prevent the exhaust of metal particles included in the fumes generated in the baking process. Accordingly, a residual time of the metal particles in the processing chamber 110 may increase, and the metal particles may be deposited on the wafer W to contaminate the wafer W.

A vortex 181 generated in a region in which the second air flow F2 and the fourth air flow F4 meet, and a vortex 182 generated in a region in which the first air flow F1 and the third air flow F3 meet, may be formed near a ring shutter. Even if the residual time of the metal particles in the vortices 181 and 182 formed near the ring shutter increases, it may not directly affect the contamination of the wafer W.

However, vortices 191 and 192 formed near the edge of the wafer W increase the residual time of the metal particles in an upper portion of the wafer W, thereby directly affecting the contamination of the wafer W.

Figure 4:
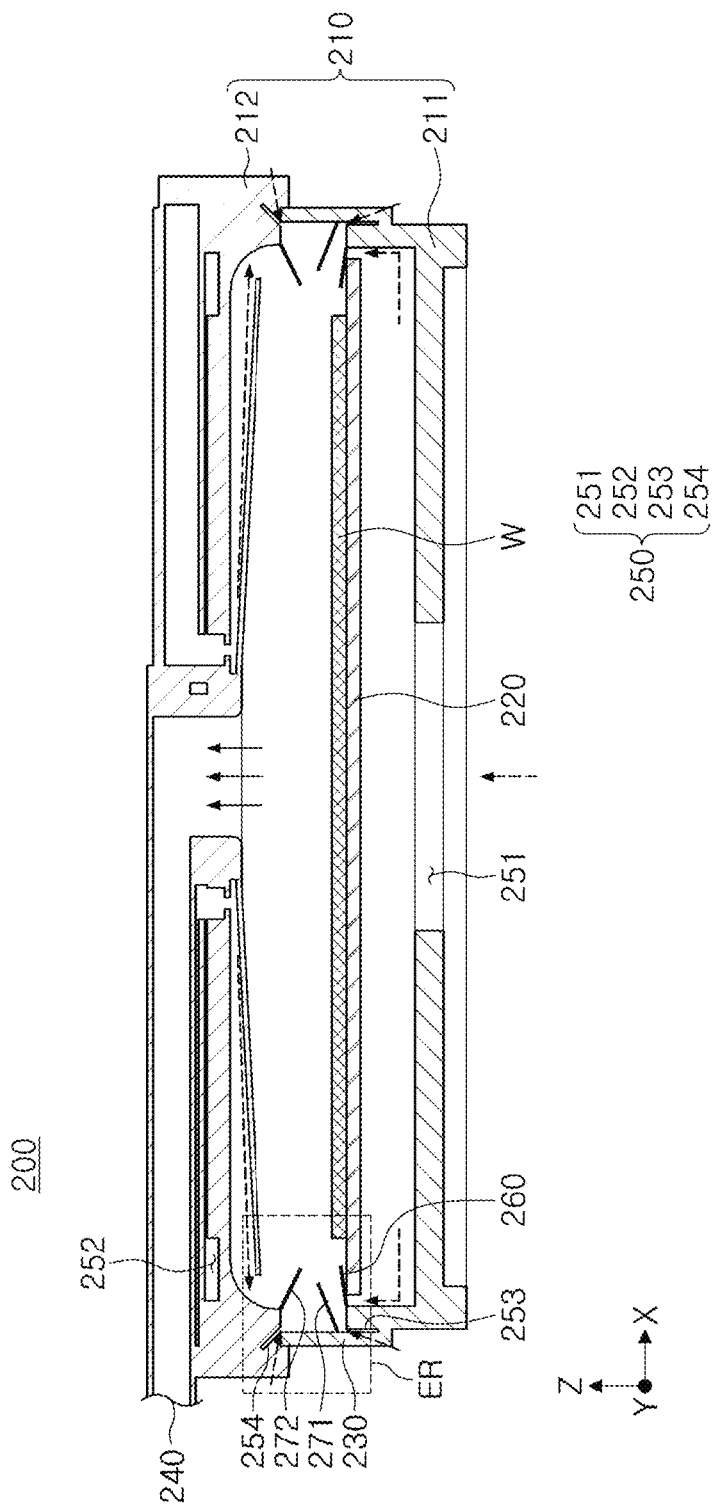
FIG. 4 is a view schematically illustrating a baking apparatus according to an example embodiment of inventive concepts.

FIG. 4 is a view schematically illustrating a baking apparatus according to an example embodiment of inventive concepts.

Referring to FIG. 4, a baking apparatus 200 according to an example embodiment of inventive concepts may correspond to the baking apparatus 100 illustrated in FIG. 2. For example, the baking apparatus 200 may include a processing chamber 210 including a lower chamber 211 and an upper chamber 212 connected by a ring shutter 230. The baking apparatus 200 may include a baking plate 220 on which a wafer W having a photoresist film formed thereon is disposed inside the processing chamber 210.

The baking apparatus 200 according to an example embodiment of inventive concepts may include flow controllers 260, 271, and 272 for discharging fumes generated, by controlling a flow of gas introduced through a plurality of inlets 250 to a discharge unit 240. The flow controllers 260, 271, and 272 may control the airflow flowing into the processing chamber 210 during the baking process in the baking apparatus 200, thereby limiting and/or preventing the formation of a vortex near an edge of the wafer W.

For example, the baking apparatus 200 may include an active flow controller 260 disposed in the lower chamber 211 adjacent to the baking plate 220. The baking apparatus 200 may include a first auxiliary flow controller 271 disposed in the lower chamber 211 adjacent to the ring shutter 230. The baking apparatus 200 may include a second auxiliary flow controller 272 disposed in the upper chamber 212 adjacent to the ring shutter 230.

In the baking apparatus 200 according to an example embodiment of inventive concepts, the active flow controller 260 may control airflow when gas injected through a first injection unit 251 is introduced into the processing chamber 210. Meanwhile, the first auxiliary flow controller 271 may control a flow of gas introduced through a third injection unit 253. The second auxiliary flow controller 272 may control airflow when gas injected through a second injection unit 252 is introduced into the processing chamber 210.

In the baking apparatus 200 according to an embodiment of inventive concepts, the active flow controller 260 may include a first module controlling a position of the active flow controller 260, and a second module for directly controlling the airflow. For example, the active flow controller 260 may move vertically in a first direction, perpendicular to the upper surface of the wafer W based on the movement of the first module. The baking apparatus 200 according to an example embodiment of inventive concepts may efficiently exhaust fumes by changing the flow of exhaust gas inside the processing chamber 210 in real time using the active flow controller 260. For example, active controller 260 may include a shaped structure (e.g., baffle, plate) for the first module and the first module may be connected to a servo motor (not shown) that may be powered by a power circuit and controlled by processing circuitry. The servo motor, in response to commands from the external controller, may move the first module bi-directionally in the first direction in units of about 1 mm. The first module may be connected to the second module in the active controller 260. The second module may be a donut-shaped plate. Therefore, according to the movement of the first module, a position of the second module of the active flow controller 260 in the first direction may also be changed. A flow rate and speed of gas introduced from a lower chamber 211 may vary according to the position of the second module of the active controller 260.

The first auxiliary flow controller 271 and the second auxiliary flow controller 272 may each be fixed. However, this is merely an example and the present disclosure may not be limited thereto. For example, at least one of the first auxiliary flow controller 271 and the second auxiliary flow controller 272 may also be designed to move for airflow control as needed.

Since the active flow controller 260, the first auxiliary flow controller 271, and the second auxiliary flow controller 272 directly control the direction of the airflow, a flow rate of the gas in the vicinity of the plurality of flow controllers 260, 271, and 272 may increase compared to other regions. Meanwhile, the flow rate of the gas flowing near the upper surface of the wafer W may affect the baking process.

Accordingly, the plurality of flow controllers 260, 271, and 272 may be disposed in consideration of the positional relationship between the plurality of flow controllers 260, 271, 272 and the wafer W. For example, the active flow controller 260, relatively adjacent to the wafer W, as compared to the first and second auxiliary flow controllers 271 and 272 may be disposed not to overlap the wafer W in the first direction.

However, the baking apparatus 200 illustrated in FIG. 4 may not be limited to the illustrated configuration. For example, the center of the baking plate 220 may further include a plurality of pins for fixing the wafer W transferred using the transfer robot 30. In addition, a heat generating unit (e.g., thermoelectric devices, circuit heaters) for heating the baking plate 220 to a desired and/or alternatively predetermined temperature may be included within or below the baking plate 220.

Figure 5:
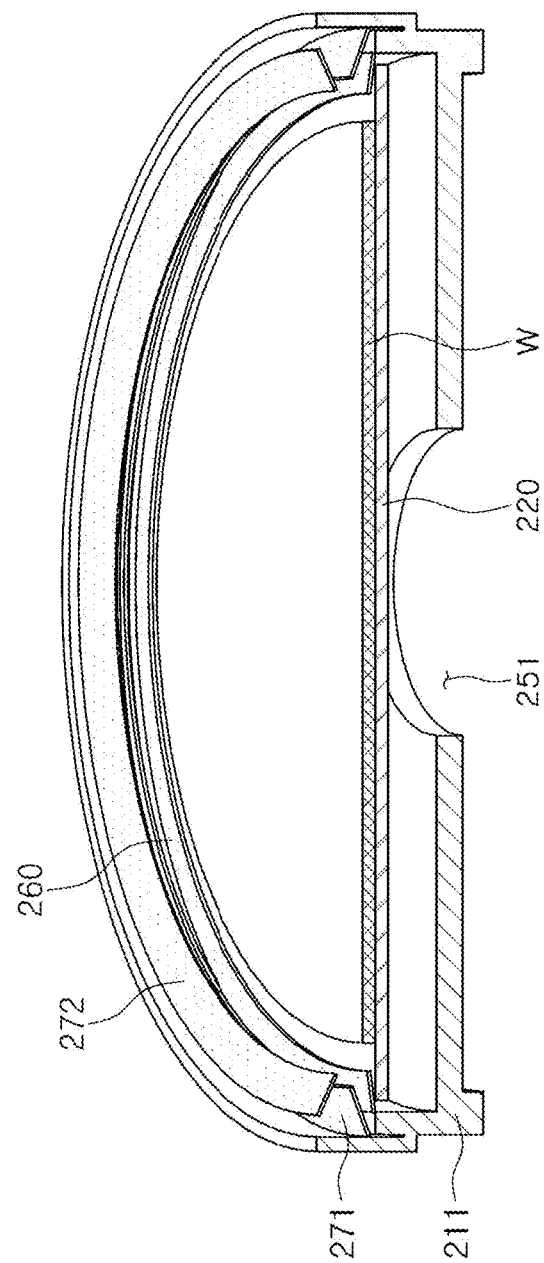
FIG. 5 is a view schematically illustrating a flow controller included in a baking apparatus according to an example embodiment of inventive concepts.
Figure 6B:
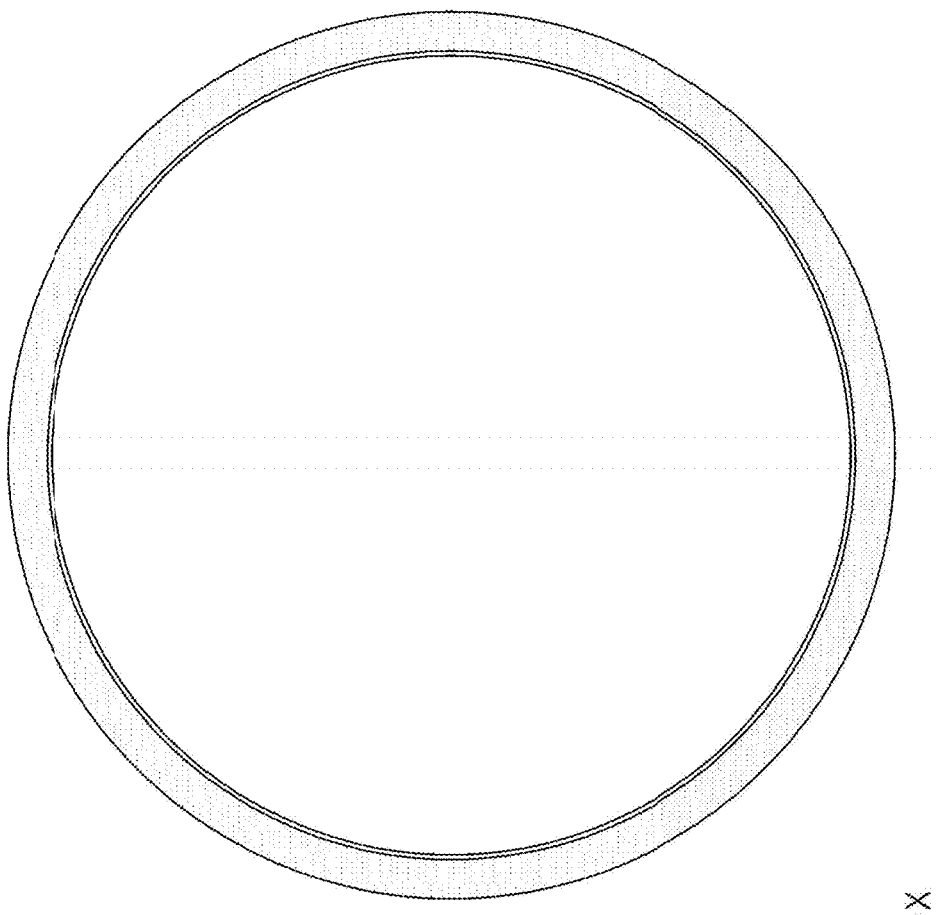

FIG. 5 is a view schematically illustrating a flow controller included in a baking apparatus according to an example embodiment of inventive concepts. FIGS. 6A and 6B are a side view and a top view of a flow controller included in a baking apparatus according to an example embodiment of inventive concepts.

FIG. 5 may be a perspective view illustrating a region near a ring shutter in which a plurality of flow controllers 260, 271, and 272 are disposed in the baking apparatus 200 according to the present example embodiment shown in FIG. 4. In one example, the plurality of flow controllers 260, 271, 272 may include an active flow controller 260, a first auxiliary flow controller 271, and a second auxiliary flow controller 272.

The active flow controller 260, the first auxiliary flow controller 271, and the second auxiliary flow controller 272 may include a donut-shaped plate inclined in a first direction (e.g., a Z direction). Each of the donut-shaped plates having an inclination may control the flow of gas introduced through one of the plurality of inlets of the baking apparatus 200.

In the baking apparatus 200 according to an example embodiment of inventive concepts, the active flow controller 260 may be disposed in a lower chamber, the first auxiliary flow controller 271 may be disposed in a ring shutter, and the second auxiliary flow controller 272 may be disposed in an upper chamber.

The active flow controller 260 and the first auxiliary flow controller 271 may have inclinations inclined in the same direction. The second auxiliary flow controller 272 may have an inclination inclined in a direction opposite to that of the active flow controller 260 and the first auxiliary flow controller 271. The plurality of flow controllers 260, 271, and 272 may have an inclination inclined toward the inside of the processing chamber.

However, the shapes of the active flow controller 260, the first auxiliary flow controller 271, and the second auxiliary flow controller 272 illustrated in FIG. 5 are merely examples and may not be limited thereto. For example, the plurality of flow controllers 260, 271, and 272 may be disposed at positions different from those shown, and may have different inclinations from those shown, according to example embodiments.

Each of FIGS. 6A and 6B may be views illustrating a cross-section and an upper surface of the active flow controller 260. In the baking apparatus 200 according to an example embodiment of inventive concepts, the active flow controller 260 may have an inclination inclined by an angle of θ with respect to the upper surface of the wafer (and/or with respect to an upper surface of baking plate 220). For example, θ may be an angle between about 15° and 80. Meanwhile, a width of the active flow controller 260 may have a value between about 9 mm and 11 mm.

Figure 7:
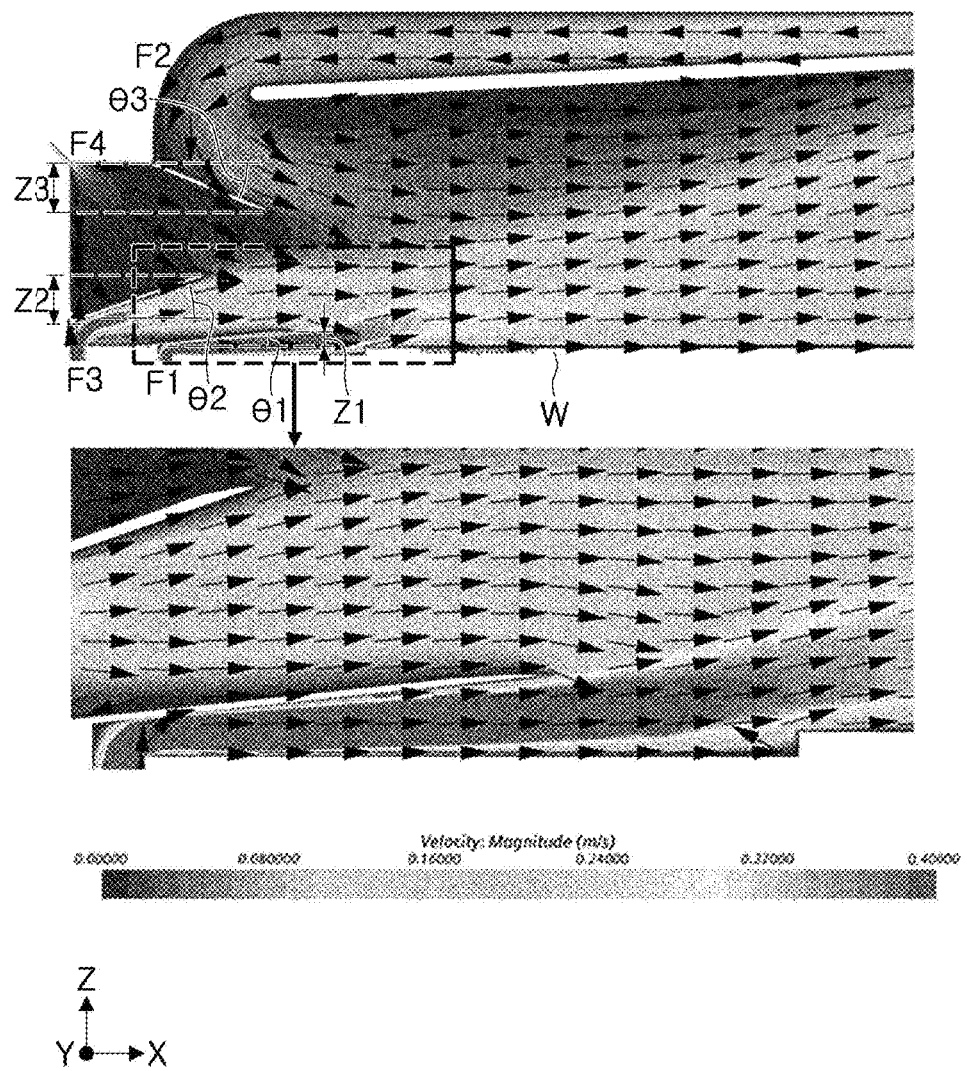
FIG. 7 is a view illustrating airflow generated in the baking apparatus shown in FIG. 4.

FIG. 7 is a view illustrating airflow generated in the baking apparatus shown in FIG. 4.

FIG. 7 may illustrate a simulation result of a flow of exhaust gas in an edge region ER when a baking process is performed in the baking apparatus 200 illustrated in FIG. 4. For example, FIG. 7 may correspond to the simulation result shown in FIG. 3.

Referring to FIG. 7, together with FIG. 4, the baking apparatus 200 may include an active flow controller 260 having an inclination, a first auxiliary flow controller 271, and a second auxiliary flow controller 272. For example, the active flow controller 260 may control a first airflow F1 introduced through a side surface of the baking plate 220, and the first auxiliary flow controller 271 may control a third airflow F3 introduced from a lower portion of the ring shutter 230, and the second auxiliary flow controller 272 may control a second airflow F2 introduced through an upper chamber 212.

The baking apparatus 200 according to an example embodiment of inventive concepts may reduce a magnitude of a vortex generated inside the processing chamber 210 using a plurality of flow controllers 260, 271, and 272. For example, exhaust airflow formed by the first to fourth vortices F1, F2, F3, and F4 may not include a vortex.

As the exhaust airflow does not include a vortex, the exhaust airflow may flow toward the center of the wafer W in an upper portion of the wafer W in the first direction (e.g., Z-direction). Accordingly, a time for the fumes generated from the baking process to remain inside the processing chamber 210 may be reduced, and contamination that may occur on the wafer W may be limited and/or minimized.

In the baking apparatus 200 according to an example embodiment of inventive concepts, the active flow controller 260 may have a height of Z1 in a first direction and an angle of θ1 with respect to a plane, perpendicular to the first direction. Meanwhile, the first auxiliary flow controller 271 may have a height of Z2 in a first direction and an angle of θ2 with respect to a plane, perpendicular to the first direction. The second auxiliary flow controller 272 may have a height of Z3 in a first direction and an angle of θ3 with respect to a plane, perpendicular to the first direction.

However, θ3 may be an angle opposite to θ1 and θ2. As shown in FIG. 7, the angles θ1, θ2, and θ3 may be relative to a plane in the X direction, such as a plane parallel to an upper surface of the baking plate 220 in FIG. 4.

For example, Z1 may be a value between about 1.35 mm and 1.65 mm, and Z2 and Z3 may have a value between about 4.5 mm and 5.5 mm θ1 may be an angle between about 5.4° and 6.6°, and θ2 and θ3 may be an angle between about 18° and 22°. As described above, θ2 and θ3 may be angles in different directions with respect to a plane, perpendicular to the first direction. Meanwhile, Z2 and Z3, and each of θ2 and θ3 may not be identical to each other. However, this is merely an example and may not be limited thereto. For example, the height of each of the plurality of flow controllers 260, 271, and 272 in a first direction and the angle with respect to a plane, perpendicular to the first direction may have different values from the above-described values.

Figure 8:
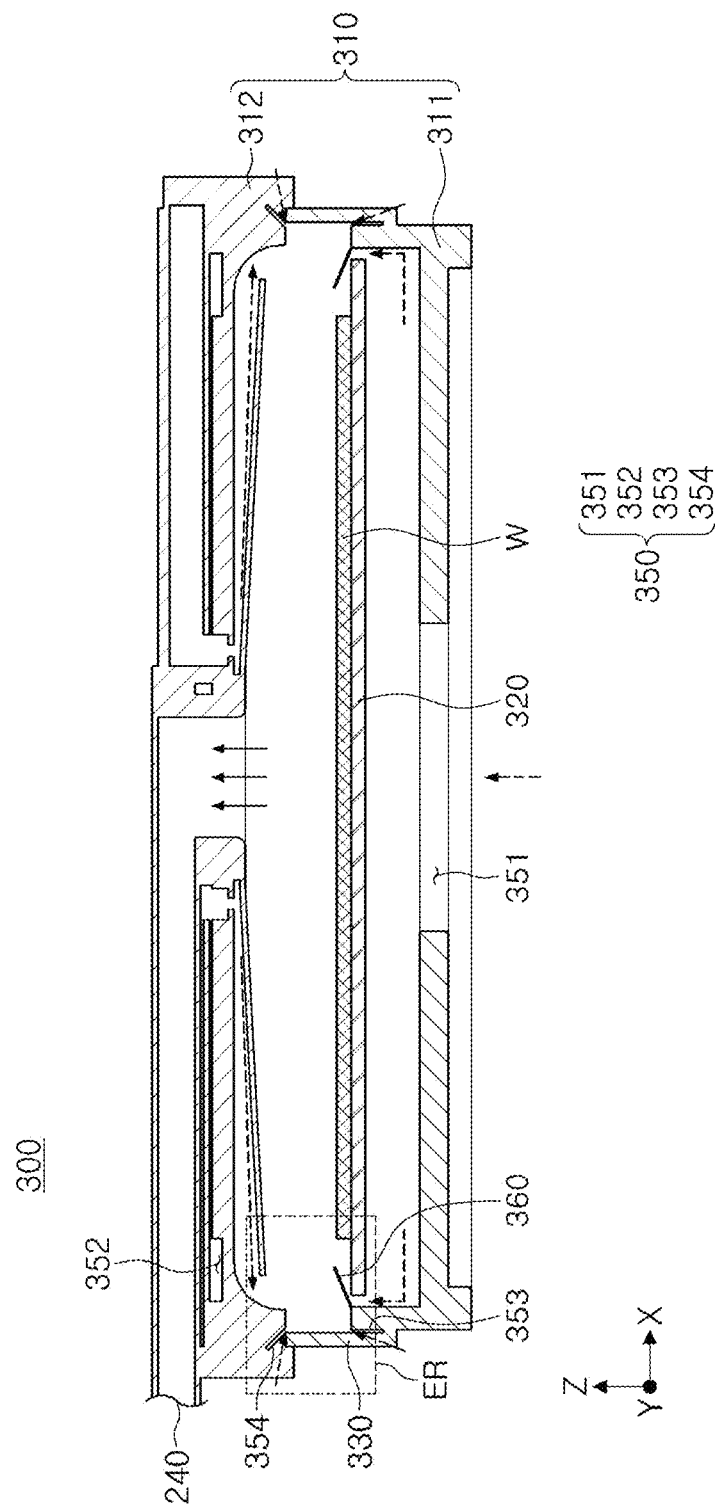
FIG. 8 is a diagram schematically illustrating a baking apparatus according to an example embodiment of inventive concepts.
Figure 9:
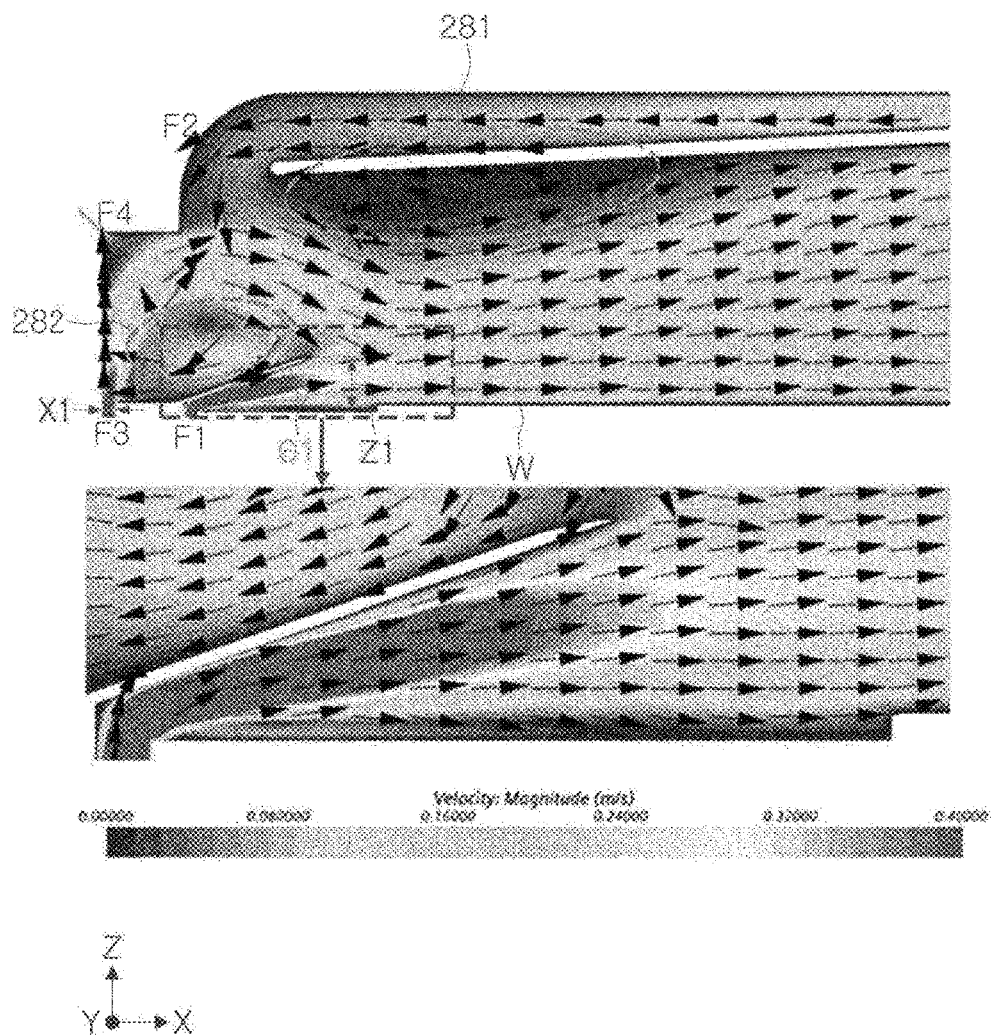
FIG. 9 is a view illustrating airflow generated in the baking apparatus shown in FIG. 8.

FIG. 8 is a view schematically illustrating a baking apparatus according to an example embodiment of inventive concepts. FIG. 9 is a view illustrating airflow generated in the baking apparatus shown in FIG. 8.

Referring to FIG. 8, a baking apparatus 300 according to an example embodiment of inventive concepts may correspond to the baking apparatus 200 illustrated in FIG. 4. For example, the baking apparatus 300 may include a processing chamber 310 including a lower chamber 311 and an upper chamber 312 connected by a ring shutter 330. In addition, the baking apparatus 300 may include a baking plate 320 and an active flow controller 360 for controlling airflow flowing into the processing chamber 310 while a baking process is performed.

For example, the active flow controller 360 of the baking apparatus 300 shown in FIG. 8 may be disposed in the lower chamber 311 adjacent to the baking plate 320, similar to the active flow controller 260 of the baking apparatus 200 shown in FIG. 4. However, the baking apparatus 300 may not include a first auxiliary flow controller 271 and a second auxiliary flow controller 272. Accordingly, an angle between the active flow controller 260 and an upper surface of a wafer W may be different from that in the baking apparatus 200 illustrated in FIG. 4.

FIG. 9 may illustrate a simulation result of a flow of exhaust gas in an edge region ER when a baking process is performed in the baking apparatus 300 illustrated in FIG. 8. For example, FIG. 9 may correspond to the simulation result shown in FIG. 7.

The baking apparatus 300 according to an example embodiment of inventive concepts may include an active flow controller 360 having an inclination, and the active flow controller 360 may control a first airflow F1 introduced through a side surface of the baking plate 220. Accordingly, the baking apparatus 300 may reduce a vortex generated inside the processing chamber 310.

Referring to FIG. 9, a vortex 281 and/or 282 may be generated inside the processing chamber 300 in the baking apparatus 300 by a second airflow F2 introduced from the upper chamber 312 and a third airflow F3 introduced form a lower portion of the ring shutter 330. However, a vortex may not be generated near an edge region of a wafer W. A vortex generated in a portion, other than near the edge region of the wafer W may not directly affect contamination of the wafer W by fumes.

Accordingly, like the simulation result in the baking apparatus 200 shown in FIG. 7, when a baking process is performed in the baking apparatus 300, exhaust airflow above the wafer W may flow toward the center of the wafer W.

In the baking apparatus 300 according to an example embodiment of inventive concepts, the active flow controller 360 may have a height of Z1 in a first direction, and an angle of θ1 with respect to a plane, perpendicular to the first direction. Meanwhile, a separation distance between the ring shutter 330 and the lower chamber 310 below the ring shutter 330 may be X1, and gas introduced through the third inlet 353 having the separation distance of X1 may form a third airflow F3.

For example, Z1 may be a value between about 4.5 mm and 5.5 mm, and θ1 may be an angle between about 18° and 22°. Meanwhile, X1 may be a value between about 0.9 mm and 1.1 mm. However, this is merely an example and may not be limited thereto.

Figure 10A:
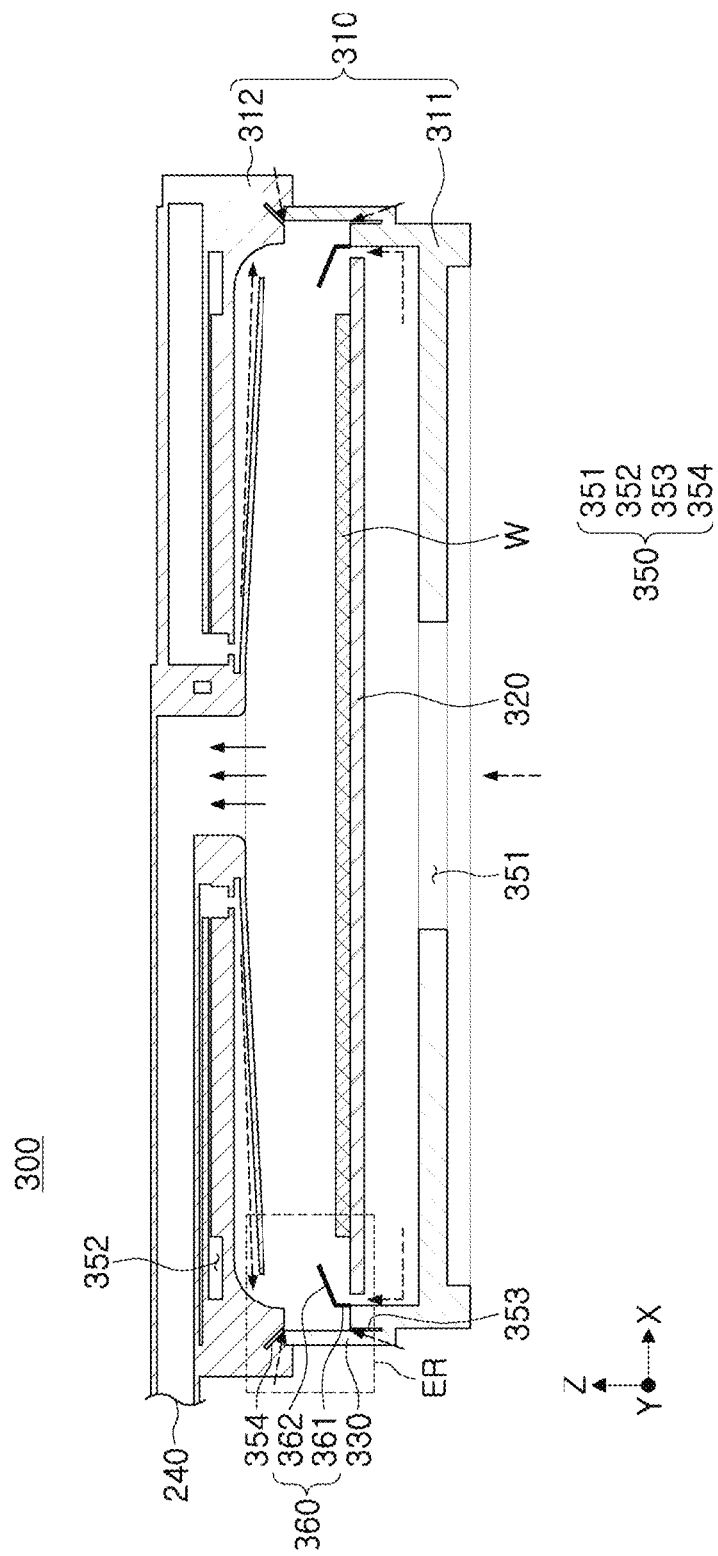
FIGS. 10A and 10B are views schematically illustrating baking apparatuses according to some example embodiments of inventive concepts.

FIG. 10A is a view schematically illustrating a baking apparatus according to an example embodiment of inventive concepts.

Referring to FIG. 10A, an active flow controller 360 included in a baking apparatus 300 may include a first module 361 for adjusting a position of an active flow controller 360 in a first direction, and a second module 362 that is configured as a donut-shaped inclined plate and directly controls airflow. The baking apparatus 300 may include a plurality of inlets, such as the first to fourth inlets 351, 352, 353, and 354.

In the baking apparatus 300 according to an example embodiment of inventive concepts, the first module 361 of the active flow controller 360 may move vertically in a first direction by an external controller. For example, the first module 361 may move in a unit of about 1 mm. For example, the first module 361 may be a shaped structure (e.g., baffle, plate) connected to a servo motor (not shown) that may be powered by a power circuit and controlled by processing circuitry. The servo motor, in response to commands from the external controller, may move the first module 361 bi-directionally in the first direction in units of about 1 mm. As shown in FIG. 10A, the first module 361 may be connected to the second module 362. Therefore, according to the movement of the first module 361, a position of the second module 362 of the active flow controller 360 in the first direction may also be changed. A flow rate and speed of gas introduced from a lower chamber 311 may vary according to the position of the second module 362.

The baking apparatus 300 according to an example embodiment of inventive concepts may vary the position of the second module 362 in the first direction in real time based on the movement of the first module 361. For example, the first module 361 may move in consideration of a flow rate and speed of gas introduced through a plurality of inlets 350, thereby controlling exhaust airflow. The exhaust airflow may not include a vortex near an edge of the wafer W.

Figure 10B:
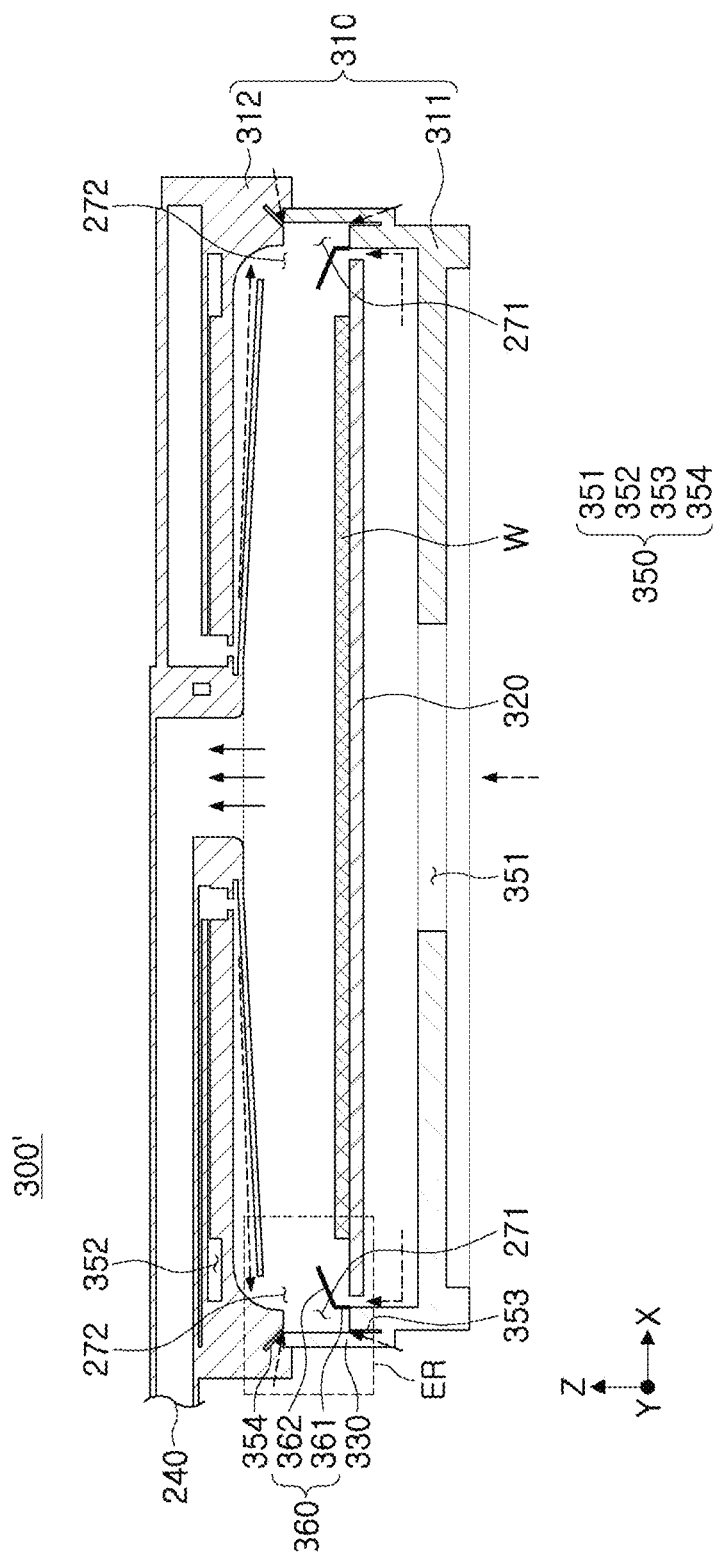

As depicted in FIG. 10B, a baking apparatus 300' according to an example embodiment may include each feature in the baking apparatus 300 of FIG. 10A, but further include the first auxiliary flow controller 271 and second auxiliary flow controller 272 described above in the baking apparatus 200 illustrated in FIG. 4.

Figure 11:
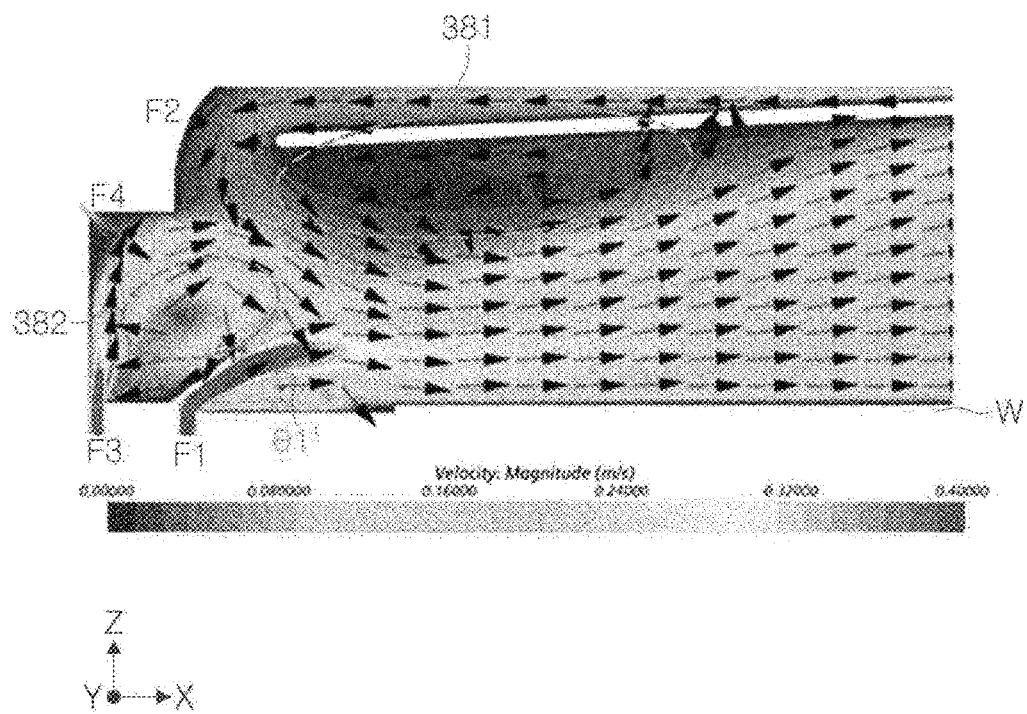
FIGS. 11 and 12 are views for explaining a baking apparatus according to an example embodiment of inventive concepts.
Figure 12:
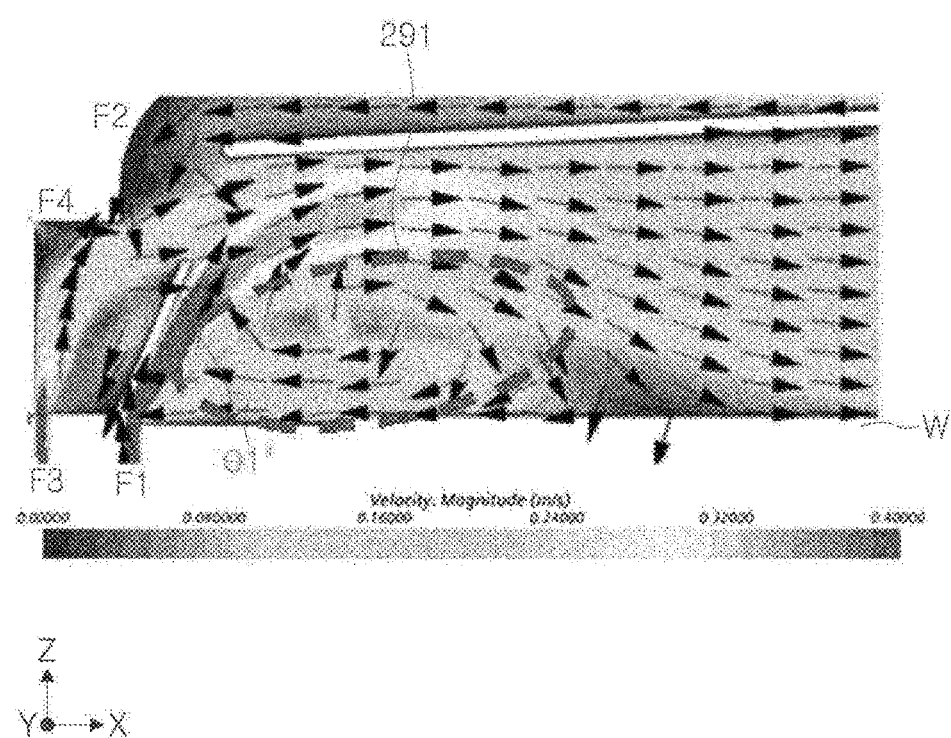

FIGS. 11 and 12 are views for illustrating a baking apparatus according to an example embodiment of inventive concepts.

FIGS. 11 and 12 may illustrate simulation results for a flow of exhaust gas in an edge region ER when an angle between the active flow controller 360 and an upper surface of the wafer W is changed in the baking apparatus 300 shown in FIG. 8. For example, FIGS. 11 and 12 may correspond to the simulation results shown in FIG. 9.

The baking apparatus 300 according to an example embodiment of inventive concepts may include an active flow controller 360 that controls a first airflow F1 to not include a vortex near an edge of a wafer W. For example, the second module 362 of the active flow controller 360 may be adjusted to have a desired and/or alternatively predetermined angle with a plane, perpendicular to a first direction.

Meanwhile, the baking apparatus 300 may vary an angle between the second module 362 and a plane, perpendicular to the first direction in consideration of a flow rate and speed of the gas introduced through a plurality of inlets 350. Thereby, the active flow controller 360 may control the exhaust airflow near the edge of the wafer W not to include a vortex.

Referring to FIG. 11, an angle between the second module 362 of the active flow controller 360 and a plane, perpendicular to the first direction may be θ1'. For example, θ1' may be 66°. In this case, the exhaust airflow may include a vortex 381 and/or 382. However, a vortex generated in a region other than near the edge of the wafer W may not directly affect contamination of the wafer W. However, this is merely an example and may not be limited thereto.

Referring to FIG. 12, an angle between the second module 362 of the active flow controller 360 and a plane, perpendicular to the first direction may be θ1". For example, θ1" may be 77°. In this case, exhaust airflow may include a vortex 291. Meanwhile, the vortex included in the exhaust airflow is generated near an edge of a wafer W, thereby directly affecting contamination of the wafer W.

In the baking apparatus 300 according to an example embodiment of inventive concepts, when the angle between the second module 362 of the active flow controller 360 and the plane, perpendicular to the first direction increases, a vortex may occur near the edge of the wafer W. For example, the second module 362 may be disposed to have an angle of about 20° or less with a plane, perpendicular to the first direction. However, this is merely an example and may not be limited thereto. For example, conditions for generating a vortex near the edge of the wafer W may vary according to example embodiments. For example, the second module 362 of the active flow controller 360 may be adjusted to have an angle between about 15° and 80° with a plane, perpendicular to the first direction.

Figure 13:
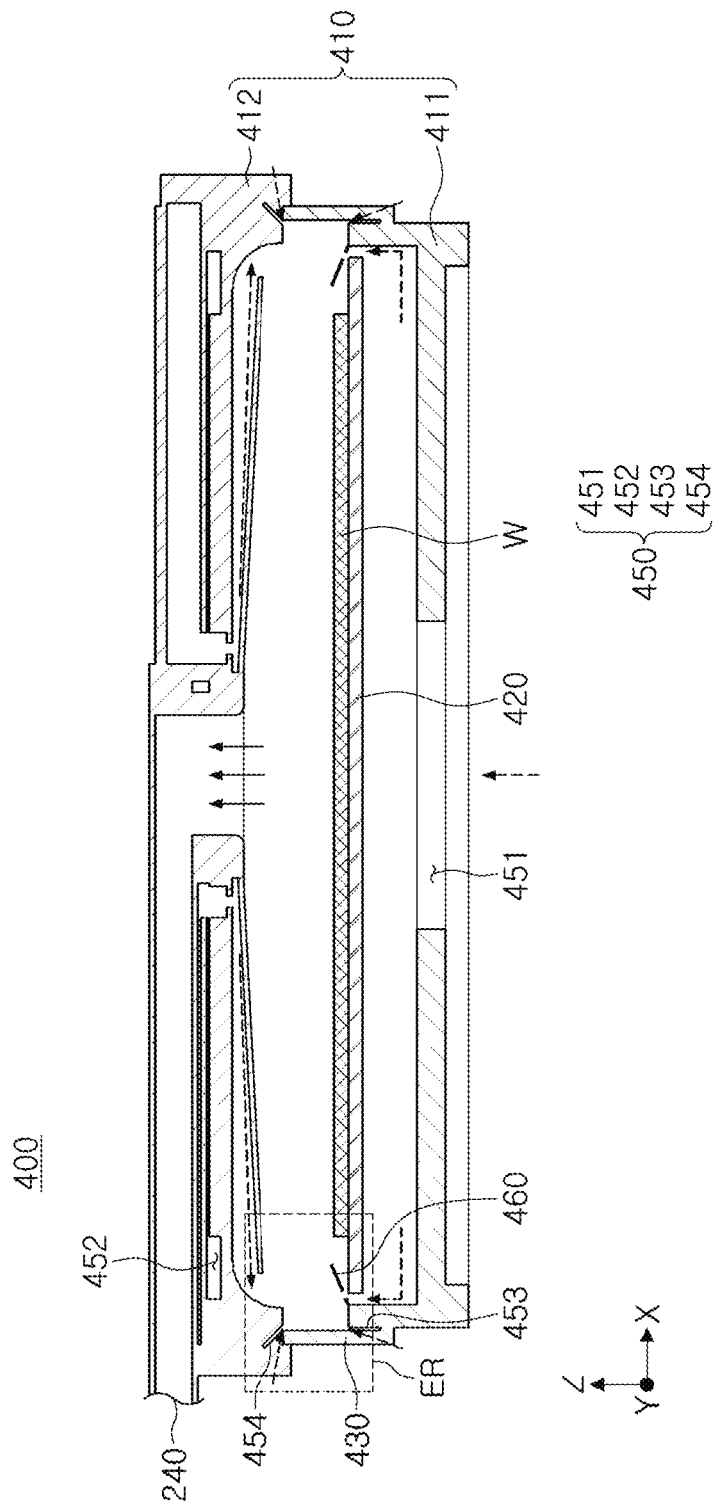
FIG. 13 is a view schematically illustrating a baking apparatus according to an example embodiment of inventive concepts.
Figure 14A:
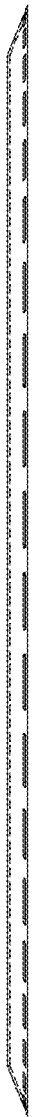
FIGS. 14A and 14B are a side view and a top view of a flow controller included in a baking apparatus according to an example embodiment of inventive concepts.
Figure 14B:
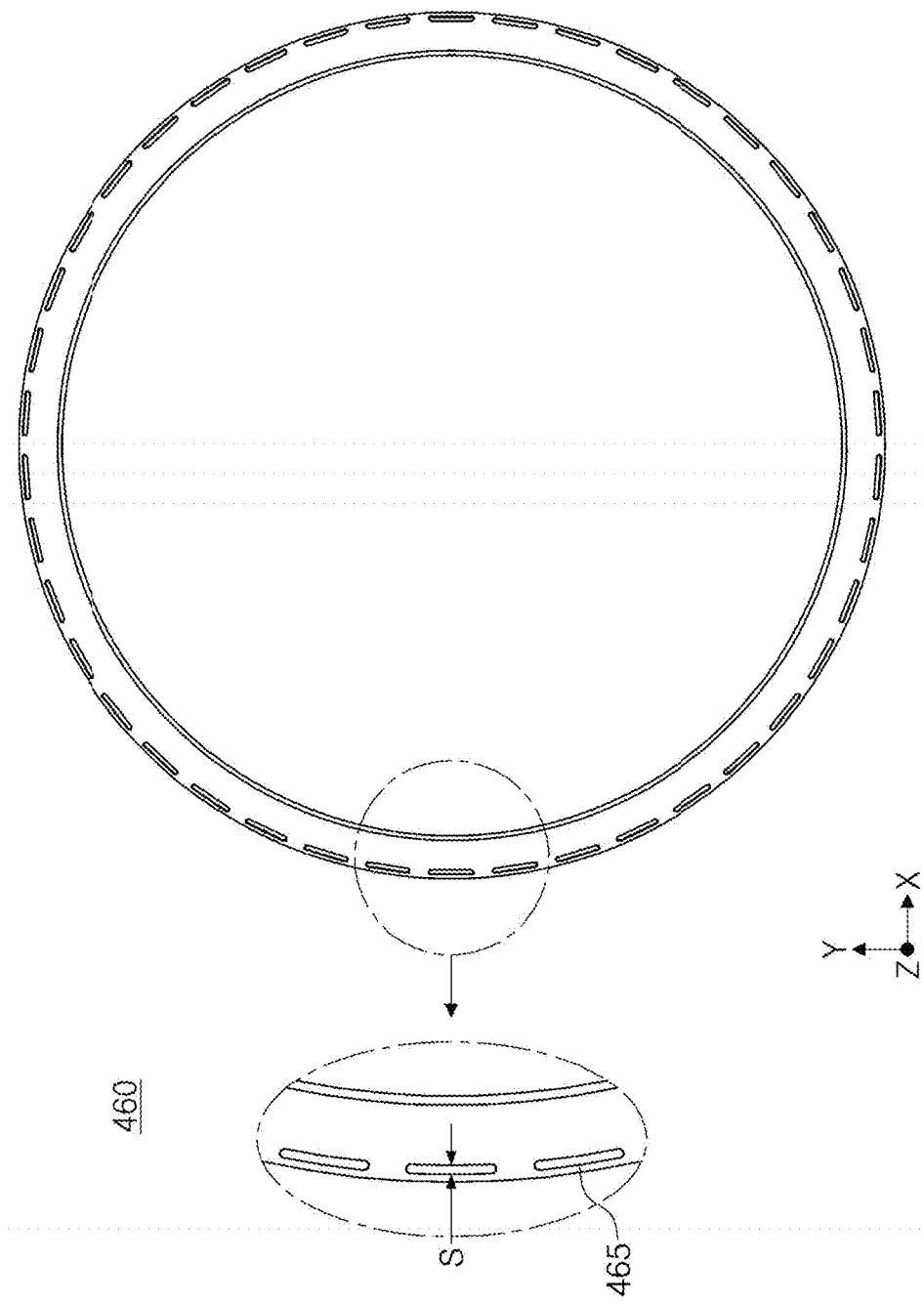

FIG. 13 is a view schematically illustrating a baking apparatus according to an example embodiment of inventive concepts. FIGS. 14A and 14B are a side view and a top view of a flow controller included in a baking apparatus according to an example embodiment of inventive concepts.

Referring to FIG. 13, a baking apparatus 400 according to an example embodiment of inventive concepts may correspond to the baking apparatus 300 illustrated in FIG. 8. For example, the baking apparatus 400 may include a processing chamber 410 including a lower chamber 411 and an upper chamber 412 connected by a ring shutter 430, and a baking plate 420. In addition, the baking apparatus 400 may include only an active flow controller 460 for controlling airflow introduced into the processing chamber 410 during a baking process without an auxiliary flow controller.

Each of FIGS. 14A and 14B may be views illustrating a cross-section and an upper surface of an active flow controller 460.

In the baking apparatus 400 according to an example embodiment of inventive concepts, the active flow controller 460 may include a plurality of slits 465 arranged in a donut shape. For example, the plurality of slits 465 may have a diameter of S in a center direction of the wafer W. For example, the diameter S of the plurality of slits 465 may have a value between about 2.25 mm and 2.75 mm. However, this is merely an example and may not be limited thereto.

Referring to FIGS. 13, 14A, and 14B together, the plurality of slits 465 included in the active flow controller 460 of the baking apparatus 400 may be configured such that some of gas introduced through a first inlet 451 may pass through the active flow controller 460. For example, the gas that has passed through the active flow controller 460 may control the flow of the gas introduced through second to fourth inlets 452, 453, and 454 to limit and/or prevent a vortex from occurring.

Figure 15:
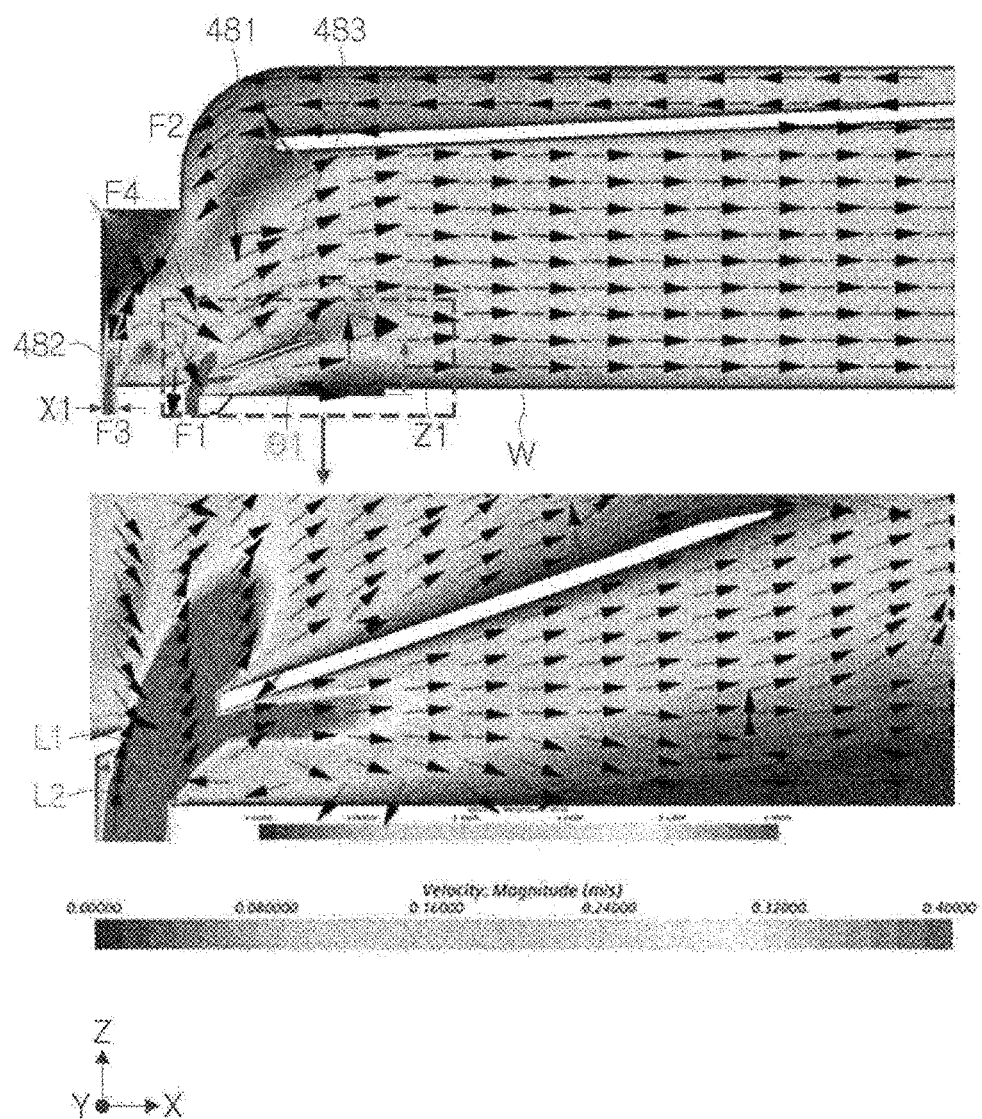
FIG. 15 is a view illustrating airflow generated in the baking apparatus shown in FIG. 13.

FIG. 15 is a view illustrating airflow generated in the baking apparatus shown in FIG. 13.

FIG. 15 may illustrate a simulation result of a flow of exhaust gas in an edge region ER when a baking process is performed in the baking apparatus 400 illustrated in FIG. 13. For example, FIG. 15 may correspond to the simulation result shown in FIG. 7.

Referring to FIG. 15, the active flow controller 460 to which the plurality of slits 465 are applied may control the first airflow F1 introduced from the lower chamber 411. Thereby, the baking apparatus 400 according to an example embodiment of inventive concepts may limit and/or prevent the occurrence of a vortex near an edge of the wafer W.

Meanwhile, a portion of the first airflow F1 may pass through the active flow controller 460 through the plurality of slits 465 included in the active flow controller 460. The gas that has passed through the active flow controller 460 may reduce magnitude of vortices 481, 482, and 483 generated in an upper end region inside the processing chamber 410 by the second to fourth airflows F2, F3, and F4.

In the baking apparatus 400 according to an example embodiment of inventive concepts, the active flow controller 460 may have a height of Z1 in a first direction and an angle of θ1 with respect to a plane, perpendicular to the first direction. For example, Z1 may be a value between about 4.5 mm and 5.5 mm, and θ1 may be an angle between about 18° and 22.

The plurality of slits 465 included in the active flow controller 460 may be disposed at positions, spaced apart by a first length L1 in the first direction with respect to an end of the passage through which the first airflow F1 flows, and spaced apart by a second length L2 in a second direction, perpendicular to the first direction. For example, the first length L1 may have a value between about 1.125 mm and 1.375 mm, and the second length L2 may have a value between about 0.9 mm and 1.1 mm. However, this is merely an example and may not be limited thereto.

Figure 16:
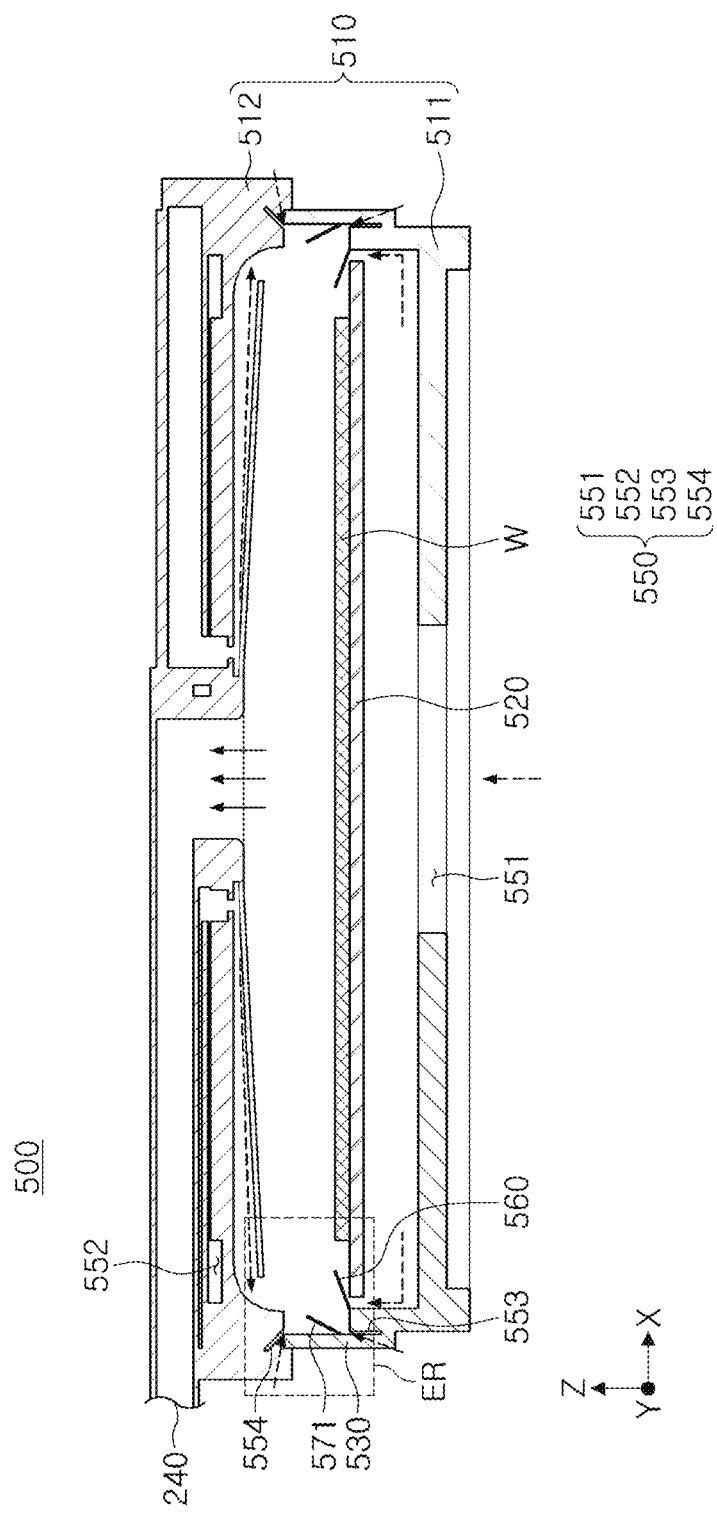
FIG. 16 is a view schematically illustrating a baking apparatus according to an example embodiment of inventive concepts.
Figure 17:
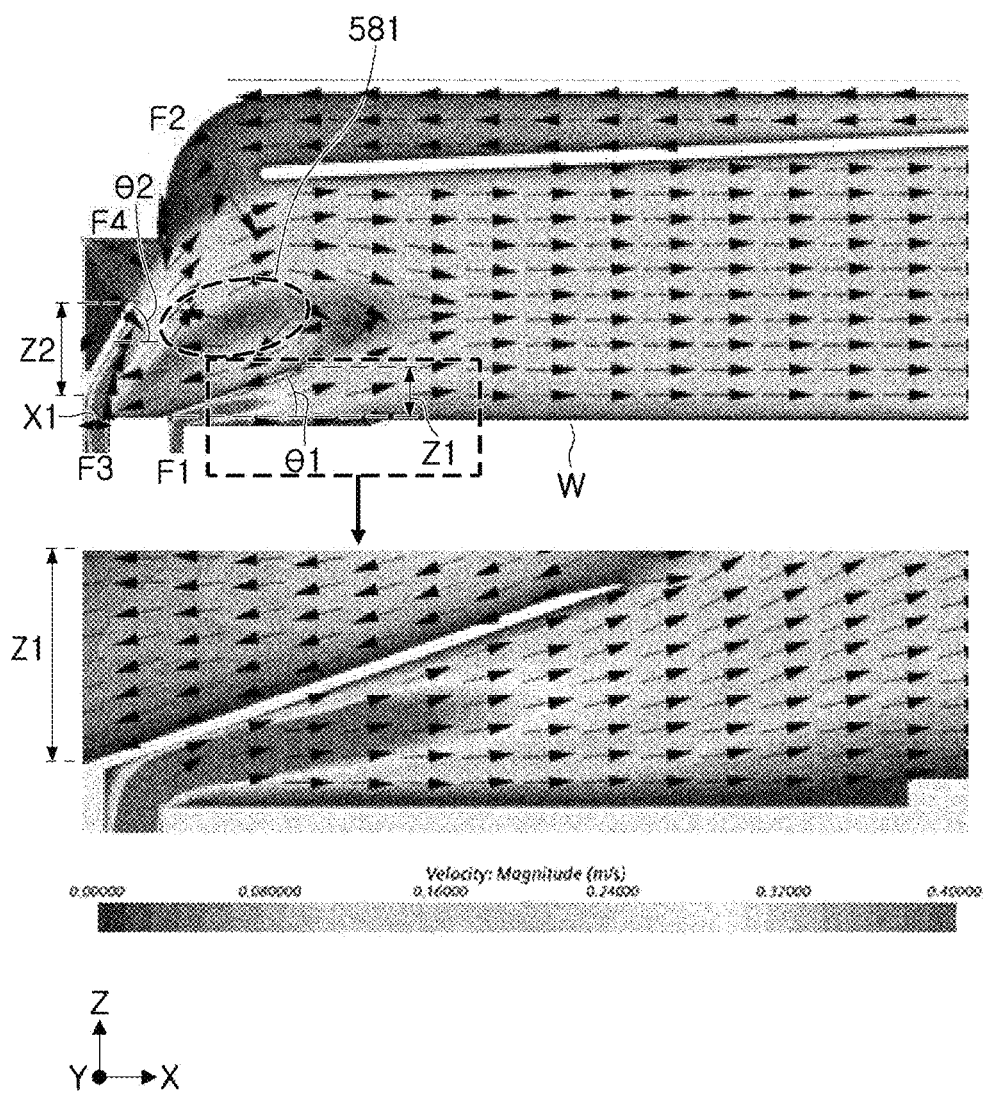
FIG. 17 is a view illustrating airflow generated in the baking apparatus shown in FIG. 16.

FIG. 16 is a view schematically illustrating a baking apparatus according to an example embodiment of inventive concepts. FIG. 17 is a view illustrating airflow generated in the baking apparatus shown in FIG. 16.

Referring to FIG. 16, a baking apparatus 500 according to an example embodiment of inventive concepts may correspond to the baking apparatus 200 illustrated in FIG. 4. For example, the baking apparatus 500 may include a processing chamber 510 including a lower chamber 511 and an upper chamber 512 connected by a ring shutter 530, and a baking plate 52.

Meanwhile, the baking apparatus 500 may include an active flow controller 560 for controlling airflow introduced into the processing chamber 510 while a baking process is performed, and a first auxiliary flow controller 571. However, it may be different from the baking apparatus 200 in that it does not include a configuration corresponding to the second auxiliary flow controller 272 shown in FIG. 4.

FIG. 17 may illustrate a simulation result of a flow of exhaust gas in an edge region ER when a baking process is performed in the baking apparatus 300 illustrated in FIG. 16. For example, FIG. 17 may correspond to the simulation result illustrated in FIG. 7.

The baking apparatus 500 according to an example embodiment of inventive concepts may include an active flow controller 560 having a desired and/or alternatively predetermined angle, with respect to a plane, perpendicular to a first direction, and a first auxiliary flow controller 571. For example, the active flow controller 560 may control a first airflow F1 introduced through a side surface of the baking plate 520, and the first auxiliary flow controller 571 may control a third airflow F3 introduced from a lower portion of the ring shutter 530.

Referring to FIG. 17, in the baking apparatus 500, in order to reduce a magnitude of a vortex that may be generated by the second to fourth airflows F2, F3, and F4, a width of a passage through which gas is introduced, which is a cause of the second airflow F2, may be adjusted by X2. For example, X2 may have a value between about 1.35 mm and 1.65 mm.

For example, X2 may be a value, greater than X1 illustrated in FIG. 9. Accordingly, it is possible to increase a flow rate of the second airflow F2 to push out the third airflow F3 and the fourth airflow F4, to reduce the magnitude of the vortex 581. Meanwhile, a vortex may still occur in an upper portion of the active flow controller 560. However, a vortex generated in a region, other than near an edge of the wafer W may not directly affect contamination of the wafer W.

According to the simulation result illustrated in FIG. 17, when a baking process is performed in the baking apparatus 500, exhaust airflow from an upper portion of the wafer W may flow toward a center of the wafer W.

In the baking apparatus 500 according to an example embodiment of inventive concepts, the active flow controller 560 may have a height of Z1 in the first direction, and an angle of θ1 with respect to a plane, perpendicular to the first direction. Meanwhile, the first auxiliary flow controller 571 may have a height of Z2 in the first direction, and an angle of θ2 with respect to a plane, perpendicular to the first direction. For example, Z1 and θ1 may be the same as in the baking apparatus 400 illustrated in FIG. 15. Z2 may be a value between about 4.5 mm and 5.5 mm, and θ2 may be an angle between about 59.4° and 72.6. However, this is merely an example and may not be limited thereto.

Figure 18A:
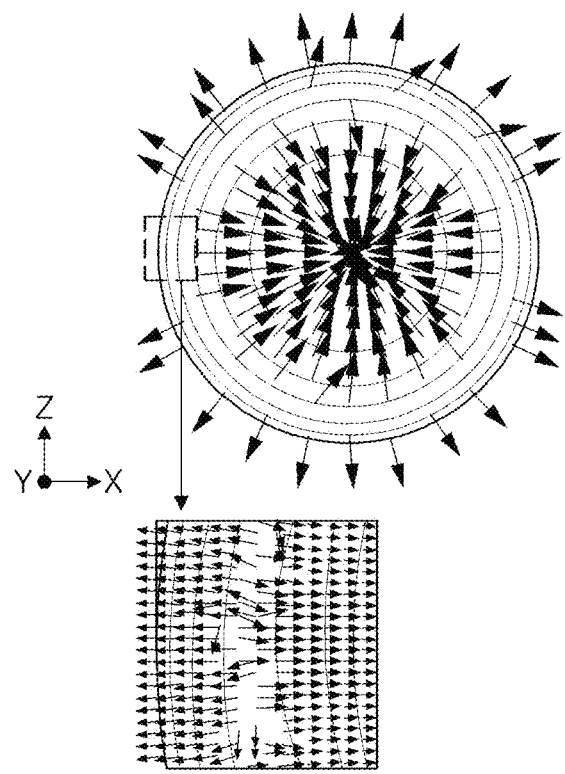
FIGS. 18A and 18B are views for illustrating an effect of a baking apparatus according to an example embodiment of inventive concepts.
Figure 18B:
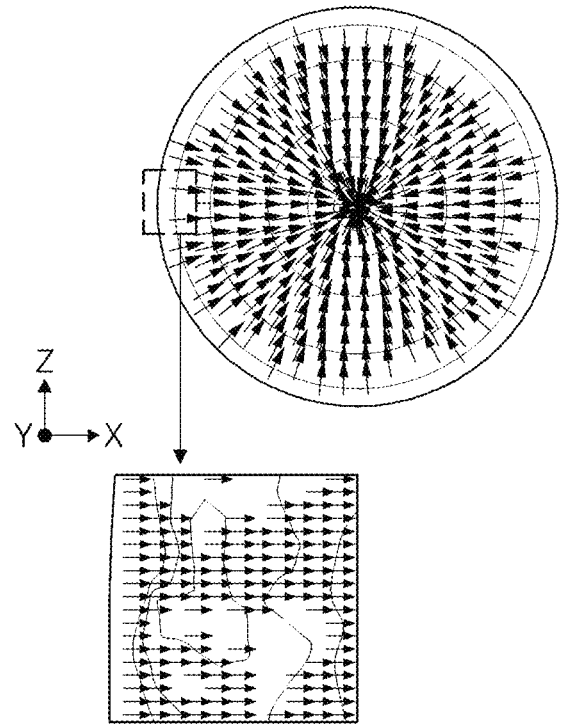

FIGS. 18A and 18B are views for illustrating an effect of a baking apparatus according to an example embodiment of inventive concepts.

FIG. 18A may be a view illustrating a direction of airflow in an upper portion of a wafer W when a baking process is performed in the baking apparatus 100 shown in FIG. 2, and FIG. 18B may be a view illustrating the direction of the airflow in the upper portion of the wafer W when a baking process is performed in any one of the baking apparatuses 200, 300, 400, and 500 shown in FIG. 4, FIG. 8, FIG. 13, and FIG. 16, respectively.

Referring to FIG. 18A, the baking apparatus 100 in which the baking process is performed may not include a separate flow controller. The plurality of airflows introduced into the processing chamber may generate a vortex at least one location inside the processing chamber. For example, the exhaust airflow near an edge of the wafer W may include a vortex.

Due to the vortex generated near the edge of the wafer W, the direction of the airflow in an upper portion of the wafer W may not be constant. For example, since the airflow flowing near the center of the wafer W is relatively less affected by the vortex, it may flow toward the center of the wafer W. On the other hand, the airflow flowing near the edge of the wafer W may flow toward the outside of the wafer W by the generated vortex.

The vortex generated near the edge of the wafer W may make a direction of airflow not constant as described above, and may increase the maximum residual time of metal particles generated by the fumes inside the processing chamber. For example, when a baking process is performed in the baking apparatus 100, the maximum residual time of the metal particles may be about 14 to 15 seconds. However, this is merely an example and is not limited thereto, and the maximum residual time of the metal particles may be 14 seconds or less or 15 seconds or more.

Referring to FIG. 18B, the baking apparatuses 200, 300, 400, and 500 in which a baking process is performed may include an active flow controller controlling at least airflow inside the processing chamber. In one example, the baking apparatuses 200, 300, 400, 500 may further include a first auxiliary flow controller and/or a second auxiliary flow controller to further assist in controlling the airflow inside the processing chamber.

At least one flow controller may limit and/or prevent a vortex being generated by airflows formed from gas introduced into the processing chamber. For example, the airflow flowing in an upper portion of the wafer W may not include a vortex. For example, the airflow moving near the edge of the wafer W may not include a vortex.

Accordingly, airflow flowing at least in an upper portion of the wafer W may flow in the same direction. For example, the airflow flowing at least in the upper portion of the wafer W may flow toward the center of the wafer W.

The at least one flow controller may reduce a maximum residual time of the metal particles generated by the fumes inside the processing chamber by controlling the flow of the airflow. When a baking process is performed in the baking apparatuses 200, 300, 400, and 500, the maximum residual time of the metal particles may be about 7 seconds. However, this is merely an example and is not limited thereto, and the maximum residual time of the metal particles may be longer or shorter than 7 seconds.

Figure 19:
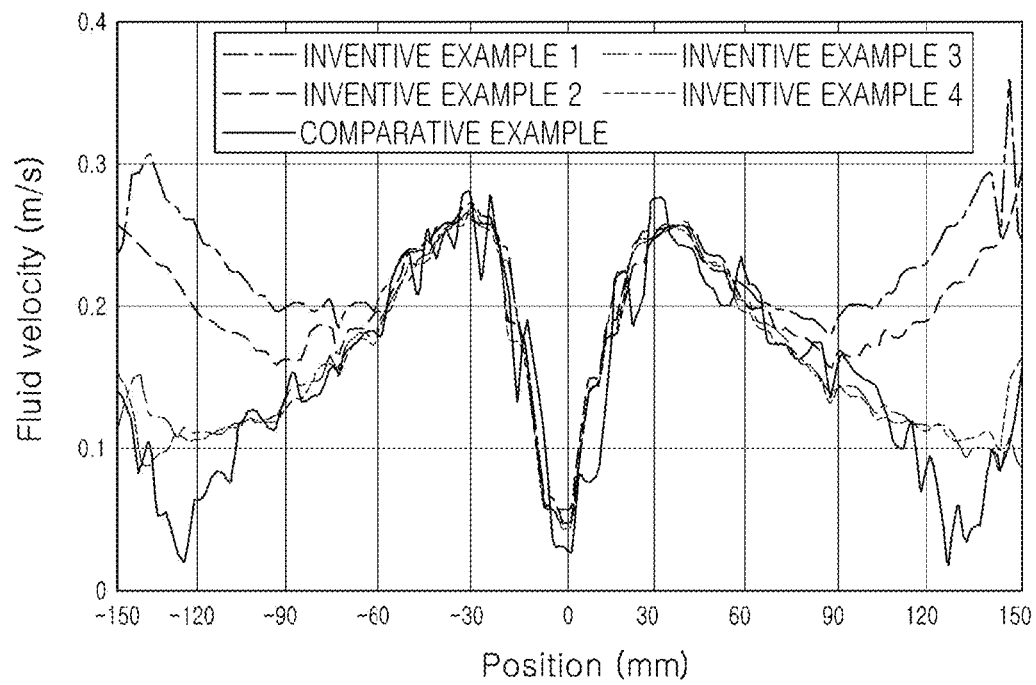
FIG. 19 is a view illustrating an effect of the baking apparatus according to an example embodiment of inventive concepts.

FIG. 19 is a view illustrating an effect of a baking apparatus according to an example embodiment of inventive concepts.

FIG. 19 may be a graph illustrating simulation results for flow velocity of airflow in an upper portion of a wafer W when a baking process is performed in the baking apparatuses 100, 200, 300, 400, and 500 shown in FIGS. 2, 4, 8, 13, and 16, respectively. For example, the simulation results in the baking apparatuses 100, 200, 300, 400, and 500 may correspond to Comparative Examples, Examples 1, 2, 3, and 4, respectively.

Referring to FIG. 19, in the comparative example corresponding to the baking apparatus 100 not including a flow controller, the flow velocity of airflow in an edge portion of the wafer W may be significantly reduced due to the generated vortex. For example, the flow velocity of the airflow in the upper portion of the wafer W at a point, spaced apart from a center of the wafer W by about 120 mm to 150 mm may have a value between about 0.01 m/s and 0.1 m/s. However, this is merely an example and may not be limited thereto.

Meanwhile, in Example 3 corresponding to the baking apparatus 400 including an active flow controller without a slit, and Example 4 corresponding to the baking apparatus 500 including an active flow controller and a first auxiliary flow controller, airflow velocity distribution may be similar. In Examples 3 and 4, although a vortex cannot be completely removed, by reducing a magnitude thereof, flow velocity of airflow in an edge portion of the wafer W may be increased, as compared to in Comparative example. For example, the airflow velocity distribution in an upper portion of the wafer W at a point, spaced apart from a center of the wafer W by about 120 mm to 150 mm may have a value between about 0.1 m/s and 0.2 m/s. However, this is merely an example and may not be limited thereto.

In Example 2 corresponding to a baking apparatus 300 including an active flow controller with a slit, the baking apparatus 300 further reduce the magnitude of the vortex, thereby reducing the flow velocity of the airflow at the edge portion of the wafer W to increase the flow velocity of the airflow at the edge portion of the wafer W, as compared to those in Example 3 and Example 4. Meanwhile, in Example 1 corresponding to the baking apparatus 200 including all of the active flow controllers, the first auxiliary flow controller, and the second auxiliary flow controller, the baking apparatus 300 may adjust such that exhaust gas does not include a vortex. Accordingly, it is possible to increase the velocity of the airflow at an edge portion of the wafer W, compared to that in Example 2. For example, the flow rate of the airflow in the upper portion of the wafer W at a point, spaced apart from the center of the wafer W by about 120 mm to 150 mm may have a value between about 0.2 m/s and 0.3 m/s. However, this is merely an example and may not be limited thereto.

As process technology develops, a photoresist coated thereto changes, and accordingly, the required exhaust specifications may also change. The baking apparatuses 100, 200, 300, 400, and 500 according to example embodiments of inventive concepts may satisfy required exhaust specifications by adjusting the active flow controller without changing an internal structure of the processing chamber itself. Furthermore, a baking apparatus having excellent expandability may be designed using an active flow controller having an independent structure.

The baking apparatuses 100, 200, 300, 300', 400, and 500 according to example embodiments of inventive concepts may reduce a maximum time that metal particles generated by fumes remain inside the processing chamber by half or less by minimizing a vortex generated near the edge of the wafer W. Accordingly, when a process time is accumulated, it is possible to reduce accumulation of the metal particles in the processing chamber and maintain homeostasis of exhaust. In addition, it is possible to improve equipment replacement and inspection cycle due to contamination of the wafer W by fumes. Meanwhile, gas flow optimization in a processing chamber using a flow active controller as in an example embodiment of inventive concepts may be used in SOH, ARC processes, and the like, requiring a baking process.

As set forth above, by controlling a flow of gas introduced to exhaust fumes generated in the baking process, a baking apparatus according to an example embodiment of inventive concepts may remove a vortex formed in a vicinity of a wafer and improving airflow velocity distribution on a surface of the wafer. Accordingly, it is possible to improve exhaust performance of fumes compared to the conventional method.

By improving airflow velocity distribution on a surface of the wafer by using the baking apparatus according to an example embodiment of inventive concepts, it is possible to improve exhaust performance of fumes, and furthermore, it is possible to shorten a productive maintenance (PM) cycle of process equipment due to pollution of fumes while reducing and/or minimizing a change of the baking apparatus according to a change in a process method.

It should be understood that embodiments described herein should be considered in a descriptive sense only and not for purposes of limitation. Descriptions of features or aspects within each embodiment should typically be considered as available for other similar features or aspects in other embodiments.

While example embodiments have been shown and described above, it will be apparent to those skilled in the art that modifications and variations could be formed without departing from the scope of inventive concepts in the present disclosure, as defined by the appended claims.

What is claimed is:

1. A baking apparatus, comprising:
   a processing chamber including a lower chamber and an upper chamber connected by a ring shutter;
   a baking plate in the processing chamber adjacent to a region in which the lower chamber and the ring shutter overlap, the baking plate for supporting a wafer having a photoresist film formed thereon;
   an active flow controller including a first module and a second module in the lower chamber adjacent to the baking plate, the active flow controller configured to move based on movement of the first module in a first direction perpendicular to an upper surface of the baking plate, and the active flow controller configured to control airflow around the second module by movement of the second module;
   a first auxiliary flow controller on a lower part of the ring shutter adjacent to the lower chamber; and
   a second auxiliary flow controller in the upper chamber adjacent to the ring shutter.

2. The baking apparatus of claim 1, wherein
   the active flow controller has a height between 1.35 mm and 1.65 mm in the first direction, and
   the active flow controller has an angle between 5.4° and 6.6° with respect to the upper surface of the baking plate.

3. The baking apparatus of claim 2, wherein
   the first auxiliary flow controller and the second auxiliary flow controller each have a height between 4.5 mm and 5.5 mm in the first direction, and
   the first auxiliary flow controller and the second auxiliary flow controller each have an angle of between 18° and 22° in opposite directions with the upper surface of the baking plate.

4. The baking apparatus of claim 1, wherein airflow flows in a central direction of the baking plate from above the baking plate.

5. The baking apparatus of claim 1, wherein the second module of the active flow controller comprises a donut-shaped inclined plate.

6. The baking apparatus of claim 1, wherein the active flow controller and the wafer do not overlap each other in the first direction.

7. A baking apparatus, comprising:
   a processing chamber including a lower chamber and an upper chamber connected by a ring shutter;
   a baking plate in the processing chamber for supporting a wafer having a photoresist film formed thereon;

a discharge unit connected to the processing chamber and configured to discharge fumes generated while the photoresist film is cured;

a plurality of inlets for introducing gas for discharging the fumes from an outside of the processing chamber; and at least one flow controller for controlling a flow direction of the gas introduced through the plurality of inlets, the at least one flow controller being configured to move in a first direction perpendicular to an upper surface of the baking plate.

8. The baking apparatus of claim 7, wherein the gas introduced through the plurality of inlets forms a first airflow introduced to a side surface of the baking plate, a second airflow introduced through the upper chamber, a third airflow introduced from a lower portion of one side of the ring shutter, and a fourth airflow introduced from an upper portion of one side of the ring shutter.

9. The baking apparatus of claim 8, wherein a discharge airflow formed by the first airflow, the second airflow, the third airflow, and the fourth airflow does not include a vortex.

10. The baking apparatus of claim 8, wherein the at least one flow controller comprises an active flow controller for controlling a flow of the first airflow.

11. The baking apparatus of claim 10, wherein the at least one flow controller further comprises a first auxiliary flow controller for controlling a flow of the third airflow and a second auxiliary flow controller for controlling a flow of the second airflow.

12. A baking apparatus, comprising:

a processing chamber including a lower chamber and an upper chamber connected by a ring shutter;

a baking plate in the processing chamber adjacent to a region in which the lower chamber and the ring shutter overlap, the baking plate for supporting a wafer having a photoresist film formed thereon; and an active flow controller including a first module and a second module in the lower chamber adjacent to the baking plate, the active flow controller configured to move based on movement of the first module in a first direction perpendicular to an upper surface of the baking plate, and the active flow controller configured to control airflow around the second module by movement of the second module, wherein, while the baking process is performed on the wafer, gas introduced from an outside of the processing chamber flows from an upper portion of the wafer to a central direction of the baking plate.

13. The baking apparatus of claim 12, wherein the active flow controller has a height between 4.5 mm and 5.5 mm in the first direction, and the active flow controller has an angle of between 18° and 22° with the upper surface of the baking plate.

14. The baking apparatus of claim 12, wherein the active flow controller comprises a plurality of slits arranged in a donut shape.

15. The baking apparatus of claim 14, wherein the plurality of slits have a diameter of between 2.25 mm and 2.75 mm.

16. The baking apparatus of claim 14, wherein the plurality of slits are spaced apart by a first length in the first direction and spaced apart by a second length in a second direction, with respect to an end of a passage through which airflow is introduced, and the second direction is perpendicular to the first direction.

17. The baking apparatus of claim 16, wherein the first length has a value between 0.9 mm and 1.1 mm, and the second length has a value between 1.125 mm and 1.375 mm.

18. The baking apparatus of claim 12, further comprising:

a first auxiliary flow controller connected to a lower portion of the ring shutter, adjacent to the lower chamber, wherein a width of a passage through which the airflow, controlled using the first auxiliary flow controller is introduced, is between 1.35 mm and 1.65 mm.

19. The baking apparatus of claim 18, wherein the first auxiliary flow controller is disposed to have a height of between 4.5 mm and 5.5 mm in the first direction, and have an angle between 59.4° and 72.6° with the upper surface of the wafer.

20. The baking apparatus of claim 12, wherein the active flow controller is adjusted to have an angle between 15° and 80° with a plane, perpendicular to the first direction.

* * * * *